(12) United States Patent
Hanaoka et al.

(10) Patent No.: US 8,530,973 B2
(45) Date of Patent: Sep. 10, 2013

(54) METHOD FOR MANUFACTURING SEMICONDUCTOR DEVICE

(75) Inventors: Kazuya Hanaoka, Kanagawa (JP); Miki Suzuki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/547,393

(22) Filed: Jul. 12, 2012

(65) Prior Publication Data

US 2013/0009247 A1   Jan. 10, 2013

Related U.S. Application Data

(63) Continuation of application No. 12/547,098, filed on Aug. 25, 2009, now Pat. No. 8,222,097.

(30) Foreign Application Priority Data

Aug. 27, 2008   (JP) .................................. 2008-217613

(51) Int. Cl.
*H01L 29/786*   (2006.01)
(52) U.S. Cl.
USPC ................... 257/366; 257/376; 257/E29.117; 257/E29.269
(58) Field of Classification Search
None
See application file for complete search history.

(56) References Cited

U.S. PATENT DOCUMENTS

| | | | |
|---|---|---|---|
| 5,654,220 A | 8/1997 | Leedy | |
| 5,688,721 A | 11/1997 | Johnson | |
| 5,985,693 A | 11/1999 | Leedy | |
| 6,271,542 B1 | 8/2001 | Emma et al. | |
| 6,717,222 B2 | 4/2004 | Zhang | |
| 6,762,076 B2 | 7/2004 | Kim et al. | |
| 6,835,974 B2 | 12/2004 | Shau | |
| 7,262,494 B2 | 8/2007 | Shiu et al. | |
| 7,312,487 B2 | 12/2007 | Alam et al. | |
| 7,485,968 B2 | 2/2009 | Enquist et al. | |
| 7,626,257 B2 | 12/2009 | Knorr | |
| 2001/0028059 A1 | 10/2001 | Emma et al. | |
| 2003/0057540 A1 | 3/2003 | Shieh | |
| 2003/0114023 A1 | 6/2003 | Kung et al. | |
| 2010/0178747 A1 | 7/2010 | Ellul et al. | |
| 2010/0181575 A1 | 7/2010 | Makita et al. | |
| 2010/0264551 A1 | 10/2010 | Farooq et al. | |

FOREIGN PATENT DOCUMENTS

| | | |
|---|---|---|
| JP | 8-222631 | 8/1996 |
| JP | 11-163129 | 6/1999 |
| JP | 2002-151816 | 5/2002 |
| JP | 2005-340377 | 12/2005 |

*Primary Examiner* — Zandra Smith
*Assistant Examiner* — Pamela E Perkins
(74) *Attorney, Agent, or Firm* — Husch Blackwell LLP

(57) ABSTRACT

It is an object to form a conductive region in an insulating film without forming contact holes in the insulating film. A method is provided, in which an insulating film is formed over a first electrode over a substrate, a first region having many defects is formed at a first depth in the insulating film by adding first ions into the insulating film at a first accelerating voltage; a second region having many defects is formed at a second depth which is different from the first depth in the insulating film by adding second ions into the insulating film at a second accelerating voltage, a conductive material containing a metal element is formed over the first and second regions; and a conductive region which electrically connects the first electrode and the conductive material is formed in the insulating film by diffusing the metal element into the first and second regions.

18 Claims, 18 Drawing Sheets

METHOD FOR MANUFACTURING SEMICONDUCTOR DEVICE

This application is a continuation of application Ser. No. 12/547,098 filed on Aug. 25, 2009 now U.S. Pat. No. 8,222,097.

BACKGROUND OF THE INVENTION

1. Field of the Invention

The present invention disclosed in this specification relates to a semiconductor device, particularly to the structure in which wirings separately provided over and under an insulating layer are connected.

2. Description of the Related Art

Multilevel interconnection is known as a wiring structure of a semiconductor integrated circuit. Multilevel interconnection needs contact holes for connecting a lower wiring and an upper wiring between which an interlayer insulating film is placed. Issues involved with multilevel interconnection include the problem of step coverage of wiring material (metal material) which fills a contact hole. If the step coverage of the wiring material which fills the contact hole is poor, a problem arises in that disconnection occurs and the upper and lower wirings cannot be connected to each other, for example.

As means to solve such a problem, a method in which a metal plug is selectively grown in a contact hole, and then an interlayer insulating film and the metal plug is planarized by chemical mechanical polishing (Patent Literature 1); a method in which an embedded metal layer is formed in a contact hole by plating (Patent Literature 2); and the like have been known.

[Patent Literature 1] Japanese Published Patent Application No. JP8-222631

[Patent Literature 2] Japanese Published Patent Application No. JP11-163129

SUMMARY OF THE INVENTION

As described above, in conventional techniques, the problem involved with step coverage have been solved using a structure in which a metal material fills a contact hole to connect a lower wiring and an upper wiring with an interlayer insulating film sandwiched therebetween. However, the method in which a metal material fills a contact hole has a variety of process constraints, for example, a film formation method and film formation conditions are limited and the method is required to be employed in combination with a planarization process.

Further, there are some problems in a step of forming a contact hole in multilevel interconnection, other than the problem involved with step coverage. For example, in the case of forming a contact hole by dry etching, there are problems of plasma damage and an etch residue. Wet etching has problems of difficulty in forming a contact hole having a small diameter in an interlayer insulating film.

In view of the above circumstances, it is one of the objects to solve the problem involved with step coverage of a connection portion of a lower wiring and an upper wiring in a multilevel interconnection structure. Regarding the multilevel interconnection structure, it is another object to form a connection portion for multilevel wiring without the step of forming a contact hole.

A main point is to form a contact between a lower wiring and an upper wiring by diffusing a conductive material in a plurality of defect portions provided at different depths in the contact portion for connecting the lower wiring and the upper wiring of the interlayer insulating film. Here, the defect portions of the interlayer insulating film have a function of segregating a conductive material such as metal, and provision of a plurality of defect portions at different depths is advantageous for forming a conductive portion penetrating the interlayer insulating film.

According to an illustrative embodiment, an insulating film is partially doped with ions in several doses at different accelerating voltages to form defect portions at different depths. Alternatively, the certain regions of the insulating film are doped with ions having different mass at the same accelerating voltage to form defect portions at different depths.

According to an illustrative embodiment, when ions are added into the insulating film in several doses, the ions used include at least one kind of hydrogen ions or rare gas ions such as helium ions, argon ions, krypton ions, or neon ions.

According to an illustrative embodiment, defect portions fanned in an insulating film has at least two parts: one on the upper side and the other on the lower side of the insulating film. In this case, defect portions on the upper side are more than defect portions on the lower side. With this structure, a conductive material such as metal can diffuse from the upper side to the lower side.

According to an illustrative embodiment, the present invention relates to a method for manufacturing a semiconductor device including forming a semiconductor element and a first electrode electrically connected to the semiconductor element over a substrate; forming an insulating film over the semiconductor element and the first electrode electrically connected to the semiconductor element; forming a first region having many defects at a first depth in the insulating film by first doping for adding first ions into the insulating film at a first accelerating voltage; forming a second region having many defects at a second depth which is different from the first depth in the insulating film by second doping for adding second ions into the insulating film at a second accelerating voltage which is different from the first accelerating voltage; forming a conductive material containing a metal element over the first and second regions having many defects; and forming a conductive region which electrically connects the first electrode and the conductive material containing the metal element, in the insulating film by diffusing the metal element from the upper region to the lower region of the first and second regions having many defects.

According to an illustrative embodiment, a semiconductor element and a first electrode electrically connected to the semiconductor element are formed over a substrate; an insulating film is formed over the semiconductor element and the first electrode electrically connected to the semiconductor element; a first region having many defects is formed at a first depth in the insulating film by first doping for adding first ions into the insulating film at a first accelerating voltage; a second region having many defects is formed at a second depth which is different from the first depth in the insulating film by second doping for adding second ions which are different from the first ions into the insulating film at the same voltage as the first accelerating voltage; a conductive material containing a metal element is formed over the first and second regions having many defects; and a conductive region which electrically connects the first electrode and the conductive material containing the metal element is formed in the insulating film by diffusing the metal element from the upper region to the lower region of the first and second regions having many defects.

Defect portions are provided in an interlayer insulating film, and a conductive material is diffused using the defect portions; thus, a connection structure of a lower wiring and an upper wiring can be provided without provision of contact holes. Here, a plurality of defect portions, that is, defect portions of different depths are provided in the interlayer insulating film, which makes the conductive material easily diffuse, and thus the connection structure of a lower wiring and an upper wiring can be provided even in the case where the interlayer insulating film is thick. Since a contact hole is not provided in the interlayer insulating film, problems concerning the process of forming a contact hole, for example, plasma damage or an etch residue can be avoided. Further, the interlayer insulating film does not have a step structure, so that the problem of step coverage can be eliminated.

Since the manufacturing step of forming a contact hole is not performed, manufacturing cost can be reduced and time in manufacturing can be reduced. In terms of reliability of a semiconductor device, connection defects (poor insulation) caused due to an etch residue in a contact hole can be prevented.

DETAILED DESCRIPTION OF THE INVENTION

Figure 1A:
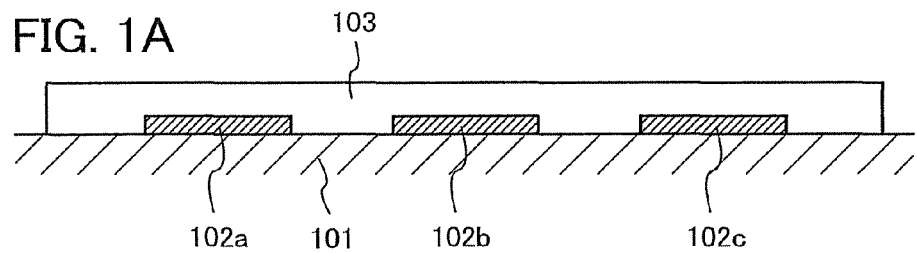
FIGS. 1A to 1D are cross-sectional views illustrating a method for forming a conductive region.

Embodiments of the present invention will be hereinafter described with reference to the accompanying drawings. However, the present invention can be implemented in many different modes and it will be readily appreciated by those skilled in the art that the modes and details can be changed in various ways without departing from the scope and spirit of the present invention. Therefore, the present invention should not be construed as being limited to the description of the embodiments. It is to be noted that like portions or portions having like functions throughout the drawings are denoted by like reference numerals, and the description thereof will not be repeated.

In addition, in this specification, a semiconductor device means a device having a circuit including semiconductor elements (for example, transistors and diodes). Further, semiconductor devices may mean general devices that can operate using semiconductor characteristics.

Embodiment 1

This embodiment will be described with reference to FIG. 1A to FIG. 1D, FIG. 1A to FIG. 1D, and FIG. 3A to FIG. 3D.

First, lower electrodes 102 (a lower electrode 102a, a lower electrode 102b, a lower electrode 102c) are formed over an insulating surface 101. The insulating surface 101 may be a substrate having an insulating surface or may be a substrate provided with an insulating film thereon.

The lower electrodes 102 may be formed from a single layer film or a film stack using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of those elements as its main component.

An insulating film 103 is formed to cover the lower electrodes 102 (see FIG. 1A). As the insulating film 103, an inorganic material such as oxide of silicon or nitride of silicon, specifically, a silicon oxide film, a silicon nitride film, a silicon oxide film containing nitrogen, or a silicon nitride film containing oxygen can be used. Further, the insulating film 103 can be formed from a single layer or a laminate of one or more selected from organic materials such as polyimide, polyamide, polyimide amide, benzocyclobutene, acrylic, and epoxy; a siloxane material; and a polysilazane material.

Siloxane has a skeleton formed by the bond of silicon (Si) and oxygen (O), and is formed using as a starting material a polymer material including at least hydrogen or at least one of fluorine, an alkyl group, and aromatic hydrocarbon as a substituent.

Polysilazane is formed using as a starting material a polymer material having the bond of silicon (Si) and nitrogen (N), which is a liquid material containing so-called polysilazane.

A resist mask 104 is formed in a region over the insulating film 103, where the lower electrode 102a, the lower electrode 102b, and the lower electrode 102c are not formed.

Figure 1B:
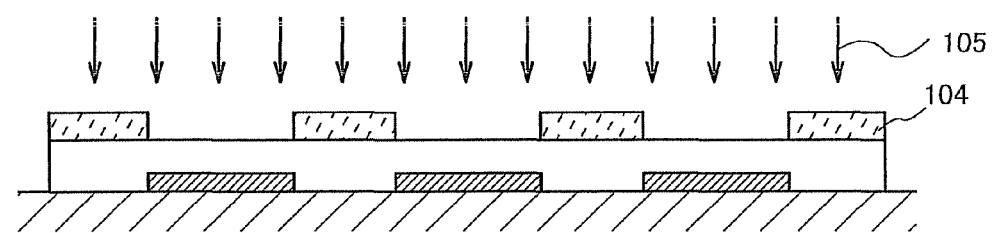

Next, first ion doping using first ions 105 is performed on the insulating film 103 at a first accelerating voltage using the resist mask 104 as a mask (see FIG. 1B). The crystal structure of the insulating film 103 is broken by performing ion doping and defects occur.

For the first ions 105, hydrogen ions or noble gas ions such as helium ions, argon ions, krypton ions, or neon ions are used. As the first ions 105, an ion species of an atom or atoms of the same kind, or ion species of different atoms which are generated by plasma excitation of a source gas containing hydrogen or a noble gas is preferably introduced.

When ions of atoms having large atomic radius, such as argon are added, more defects can be formed in the insulating film 103.

Note that in this specification, the term "ion doping" refers to a method in which an ionized gas generated from a source gas is accelerated by an electric field and added to an object without being subjected to mass separation.

Figure 1C:
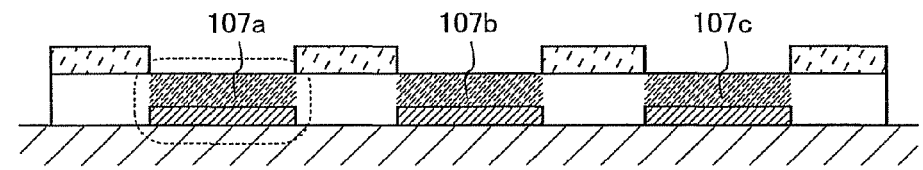

By first ion doping, doped regions 107 (a region 107a, a region 107b, and a region 107c) are formed inside the insulating film 103 where the resist mask 104 is not formed (see FIG. 1C). Inside each of the regions the region 107a, the region 107b, and the region 107c, defects are created due to the first ion doping.

However, in ion doping, the concentration peaks at a certain depth, so the concentration of defects becomes highest at a certain depth in the regions 107. Regions having the highest defect concentration in the regions 107 (region 107a, region 107b, region 107c) are denoted by regions 109 (a region 109a, a region 109b, and a region 109c).

Figure 1D:
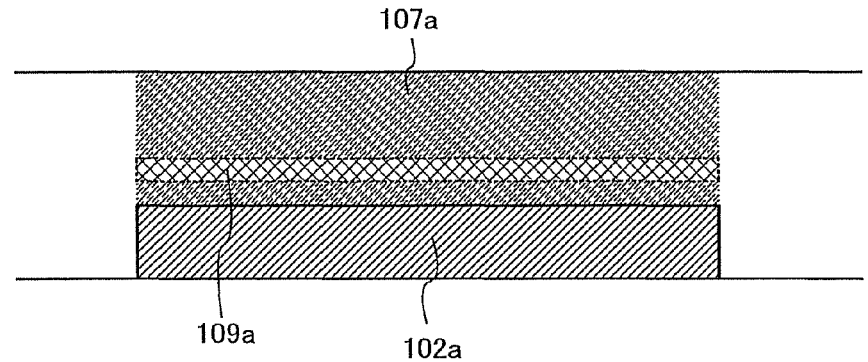

FIG. 1D illustrates the region 109a having many defects, which is formed in the region 107a doped with the first ions 105.

Figure 2A:
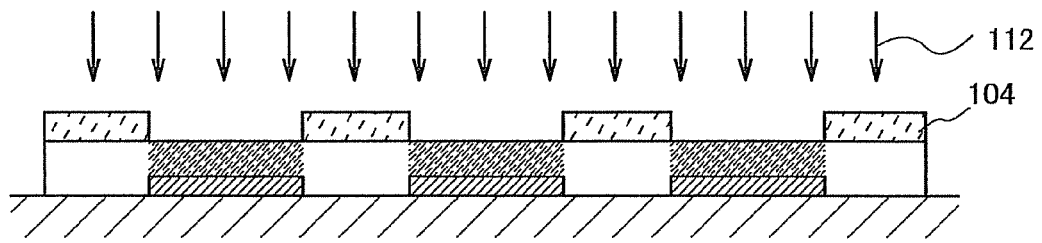
FIGS. 2A to 2D are cross-sectional views illustrating a method for forming a conductive region.

Then, second ion doping is performed using second ions 112 at a second accelerating voltage (see FIG. 2A).

Figure 2B:
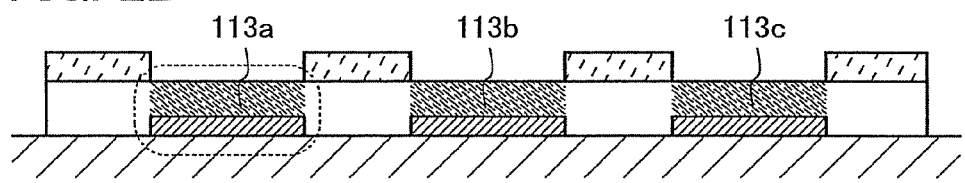

Inside the insulating film 103 where the resist mask 104 is not formed, doped regions 113 (a region 113a, a region 113b, and a region 113c) are formed by the second ion doping (see FIG. 2B). Also inside each of the regions the region 113a, the region 113b, and the region 113c, defects are created due to the second ion doping.

Further, the regions having the highest defect concentrations in the regions 113 (the region 113a, the region 113b, the region 113c) are denoted by regions 115 (a region 115a, a region 115b, and a region 115c).

Figure 2C:
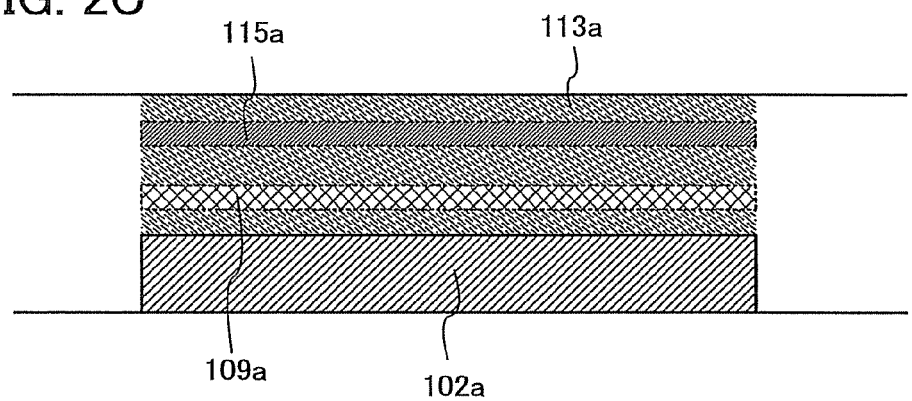

FIG. 2C illustrates the region 115a having many defects in the region 113a doped with the second ions 112.

In this embodiment, the accelerating voltage in the second ion doping is lower than the accelerating voltage in the first ion doping. Thus, the region 115a is formed above the region 109a.

The second ions 112 may be either the same as or different from the first ions 105. It is to be noted that as above, when ions of atoms having large atomic radius are added, more defects can be formed; therefore, atoms having large atomic radius and atoms having small atomic radius may be used properly as necessary.

In the case where the first ions 105 and the second ions 112 are the same, the higher the accelerating voltage is, the deeper the ions are introduced; thus, one kind of ions may be used as the first ions 105 and the second ions 112 and accelerating voltages may be varied to determine the depth of the regions 109 and the regions 115.

Further, although the same accelerating voltage is applied, ions of heavy atoms are added more shallowly than ions of lightweight atoms; therefore, doping may be performed at the same accelerating voltage using heavy atom ions as either the first ions 105 or the second ions 112 and lightweight atom ions as the others.

In this embodiment, the first and second ion dopings are performed using hydrogen ions as the first ions 105 and argon ions as the second ions 112 at the second accelerating voltage which is lower than the first accelerating voltage. Thus, the region 115a on the upper side has more defects than the region 109a on the lower side.

In the step described below, a metal element in a metal film 116 formed over the insulating film 103 is diffused into the region 113a. At that time, if the region 115a on the upper side has more defects than the region 109a on the lower side, the metal element easily diffuses from the upper side to the lower side.

Figure 2D:
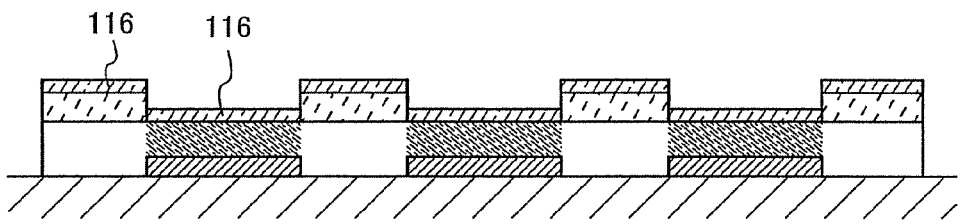

The metal film 116 is formed over the insulating film 103 and the resist mask 104 (see FIG. 2D). The metal film 116 can be formed from a conductive material film containing a metal element by sputtering, plating, or the like. A single layer film or a film stack using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), and neodymium (Nd), or an alloy material or a compound material containing any of those elements as its main component may be formed as the metal film 116. In addition, a single layer film or a film stack may be formed using an element selected from carbon (C) and silicon (Si), or an alloy material or a compound material containing one or both of those elements as its main components.

Alternatively, a conductive paste containing the above metal element may be applied by coating to form the metal film 116. In addition, when the conductive paste containing a metal element is used, the metal film 116 can be formed only over the insulating film 103 without being formed over the resist mask 104.

If the metal element contained in the metal film 116 is an interstitial atom such as nickel (Ni), copper (Cu), or silver (Ag), it can easily enter the insulating film 103.

In this embodiment, a nickel film is formed over the insulating film 103 as the metal film 116 by sputtering.

Figure 3A:
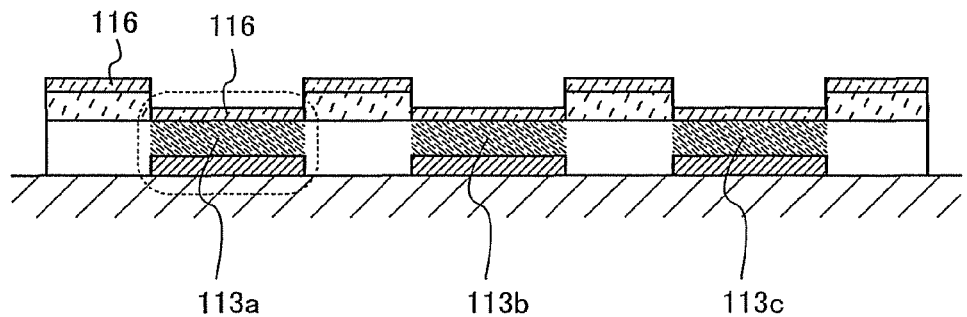
FIGS. 3A to 3D are cross-sectional views illustrating a method for forming a conductive region.

Next, the metal element in the metal film 116 is diffused by heating process into the regions 113 in the insulating film 103 through a region where the metal film 116 and the insulating film 103 are in contact with each other (see FIG. 3A).

Figure 3B:
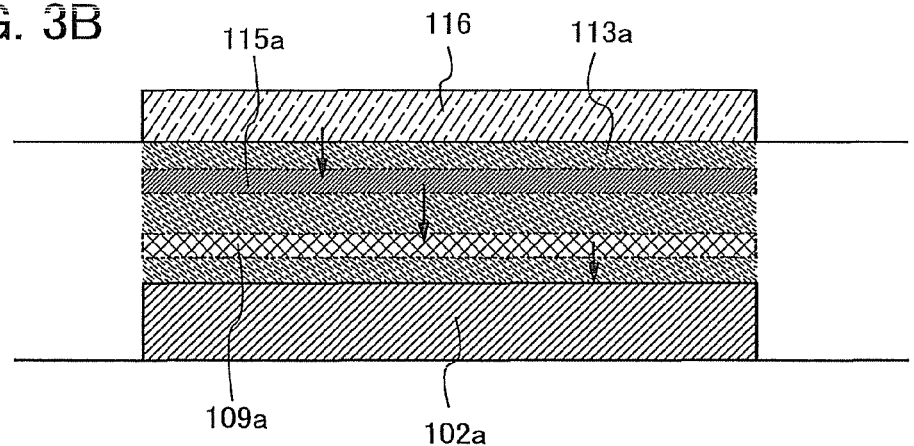

FIG. 3B illustrates a magnified drawing of the region 113a, one of the regions 113. In the region 113a, first, the metal element is diffused into the region 115a. Since the region 115a has many defects through the above steps, the metal element can easily diffused into it. Thus, the region 115a serves as a first storage region of the metal element.

Further, the metal element is diffused from the region 115a to the region 109a. Thus, the region 109a serves as a second storage region of the metal element. In the case where there is only one storage region, that is, in the case where only one of the regions region 115a and the region 109a is formed, there would be a risk of the metal element stored in the storage region not being diffused. Therefore, it is advantageous to form two storage regions in the depth direction of the insulating film 103 in forming a conductive region.

Figure 3C:
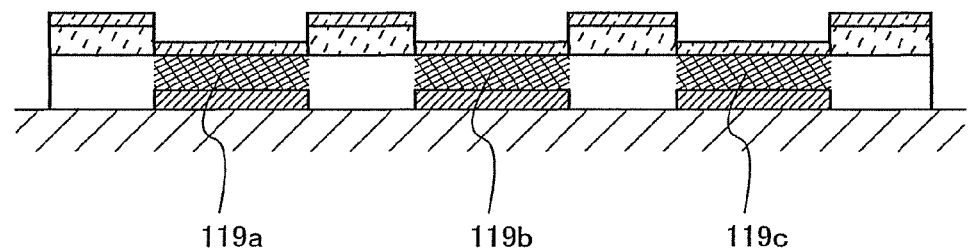

The metal element is diffused further below the region 109a and reaches the lower electrode 102a; thus, a conductive region 119a (a conductive region 119b and a conductive region 119c besides) is formed which electrically connects the metal film 116 which is an upper electrode and the lower electrode 102a (see FIG. 3C).

The heating process may be performed by laser annealing, lamp annealing, or furnace annealing.

Figure 3D:
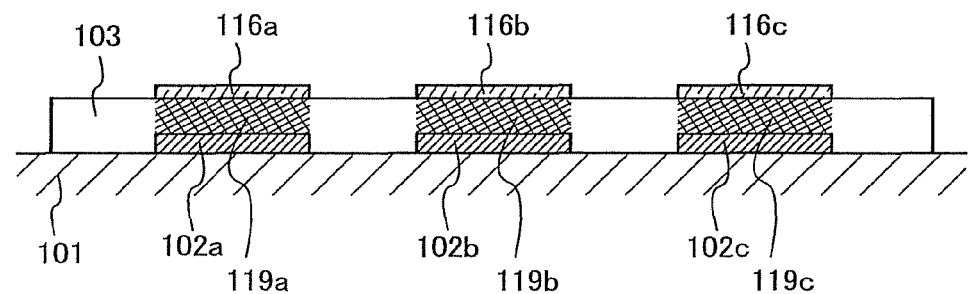

Next, the resist mask 104 and the metal film 116 over the resist mask 104 are removed (see FIG. 3D). Parts of the metal film 116 over the conductive region 119a, the conductive region 119b, and the conductive region 119c are referred to as an electrode 116a, an electrode 116b, and an electrode 116c, respectively.

Alternatively, the resist mask 104 and the metal film 116 over the resist mask 104 may be removed before the heating process.

Further, the resist mask 104 may be removed after the addition of the second ions 112, the metal film 116 may be formed over the insulating film 103 after that, and then, parts of the metal film 116 which are over the region 113a, the region 113b, and the region 113c may be removed by etching.

As described above, the insulating film 103 can be obtained which has conductive regions 119 which connect the surface of the insulating film 103 and the rear surface thereof, in other words, which make electrical continuity in the film thickness direction. Accordingly, an element having such an insulating film as the insulating film 103 can be obtained.

Embodiment 2

In this embodiment, an example of manufacturing a semiconductor device including thin film transistors (TFT) will be described with reference to FIG. 4A to FIG. 4C, FIG. 5A to FIG. 5C, and FIG. 6A to FIG. 6D.

Figure 4A:
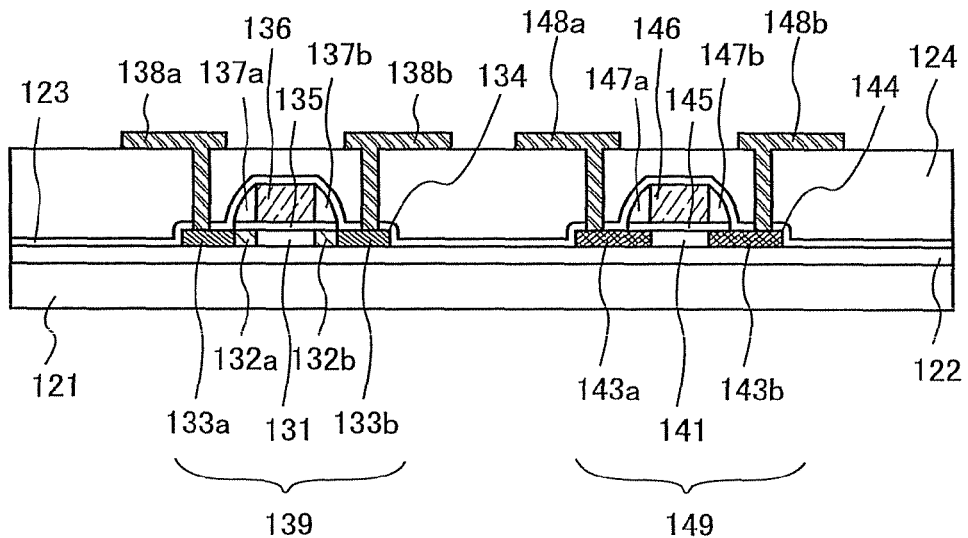
FIGS. 4A to 4C are cross-sectional views illustrating a method for manufacturing a semiconductor device.

First, a TFT 139, a TFT 149, an insulating film 123, an insulating film 124, an electrode 138a, an electrode 138b, an electrode 148a, and an electrode 148b are formed over a base film 122 on a substrate 121 (see FIG. 4A).

The substrate 121 is a substrate having an insulating surface, for example, a glass substrate, a quartz substrate, a sapphire substrate, a silicon wafer or a metal plate, which has an insulating film formed on its surface, or the like. In this embodiment, a glass substrate is used as the glass substrate 121.

The base film 122 is provided so that impurities in the substrate 121 do not mixed into the TFT 139 and the TFT 149, and the base film 122 is not provided if not necessary. As the base film 122, a single layer film of any one of a silicon oxide film, a silicon nitride film, a silicon nitride film containing oxygen, and a silicon oxide film containing nitrogen, or a film stack in which two or more of such films are stacked.

The TFT 139 has a semiconductor island film 134, a gate insulating film 135, a gate electrode 136, and a sidewall 137a and a sidewall 137b which are formed on side surfaces of the gate electrode 136.

In the semiconductor island film 134, a channel formation region 131, a low concentration impurity region 132a, a low concentration impurity region 132b, a high concentration impurity region 133a, and a high concentration impurity region 133b are formed. The low concentration impurity region 132a and the low concentration impurity region 132b, and the high concentration impurity region 133a and the high concentration impurity region 133b which are a source region and a drain region each contain an impurity element which imparts n-type conductivity, for example, phosphorus (P) or arsenic (As), and the TFT 139 is an n-channel TFT.

The TFT 149 has a semiconductor island film 144, a gate insulating film 145, a gate electrode 146, and a sidewall 147a and a sidewall 147b which are formed on side surfaces of the gate electrode 146.

In the semiconductor island film 144, a channel formation region 141, and a high concentration impurity region 143a and a high concentration impurity region 143b which are a source region and a drain region are formed. The high concentration impurity region 143a and the high concentration impurity region 143b each contain an impurity element which imparts p-type conductivity, for example, boron (B), and the TFT 149 is a p-channel TFT.

The insulating film 123 is formed to cover the TFT 139 and the TFT 149. The insulating film 123 may be formed using a silicon nitride film or a silicon nitride film containing oxygen.

An insulating film 124 is formed to cover the insulating film 123. An inorganic material such as oxide of silicon or nitride of silicon, specifically, a silicon oxide film, a silicon nitride film, a silicon oxide film containing nitrogen, or a silicon nitride film containing oxygen can be used as the insulating film 124. Further, the insulating film 124 can be formed from a single layer of one or more of organic materials such as polyimide, polyamide, polyimide amide, benzocyclobutene, acrylic, and epoxy; a siloxane material; and a polysilazane material, or a laminate thereof.

Over the insulating film 124, the electrode 138a electrically connected the high concentration impurity region 133a and the electrode 138b electrically connected to the high concentration impurity region 133b, the electrode 148a electrically connected to the high concentration impurity region 143a, and the electrode 148b electrically connected to the high concentration impurity region 143b are formed.

The electrode 138a, the electrode 138b, the electrode 148a, and the electrode 148b may be formed using the same material as the lower electrodes 102 described in Embodiment 1. Specifically, the electrode 138a, the electrode 138b, the electrode 148a, and the electrode 148b may be formed from a single layer film or a film stack using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of those elements as its main component.

Note that one or more of the electrode 138a, the electrode 138b, the electrode 148a, and the electrode 148b may be formed as wirings, and electrodes and wirings may be formed separately and then electrically connected to each other.

Figure 4B:
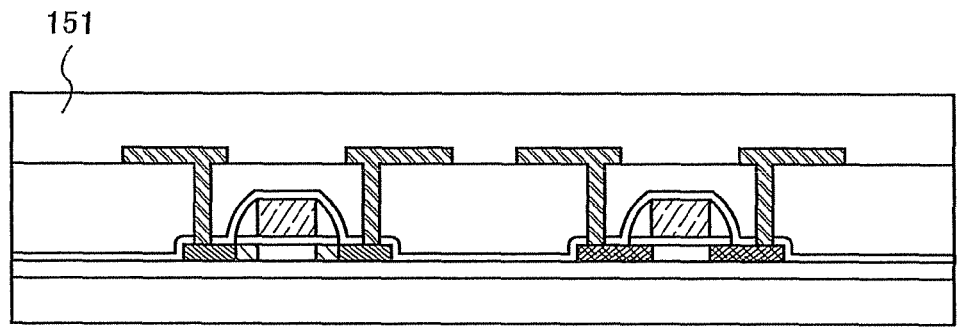
Figure 4C:
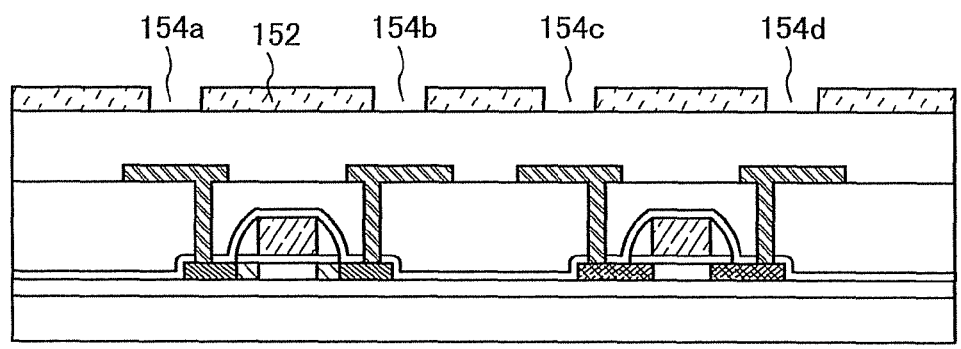

Next, an insulating film 151 is formed to cover the insulating film 124, the electrode 138a, the electrode 138b, the electrode 148a, and the electrode 148b (see FIG. 4B). As the insulating film 151, the same material as the insulating film 103, namely, an inorganic material such as oxide of silicon or nitride of silicon; specifically, a silicon oxide film, a silicon nitride film, a silicon oxide film containing nitrogen, or a silicon nitride film containing oxygen can be used. Further, the insulating film 151 can be formed from a single layer or a laminate of one or more selected from organic materials such as polyimide, polyamide, polyimide amide, benzocyclobutene, acrylic, and epoxy; a siloxane material; and a polysilazane material.

Then, as with the manufacturing steps illustrated in FIG. 1B of Embodiment 1, a resist mask 152 is formed over the insulating film 151. At that time, an opening 154a, an opening 154b, an opening 154c, and an opening 154d are formed where the resist mask 152 is not formed (see FIG. 5C).

The opening 154a, the opening 154b, the opening 154c, and the opening 154d are formed above the electrode 138a, the electrode 138b, the electrode 148a, and the electrode 148b, respectively.

Figure 5A:
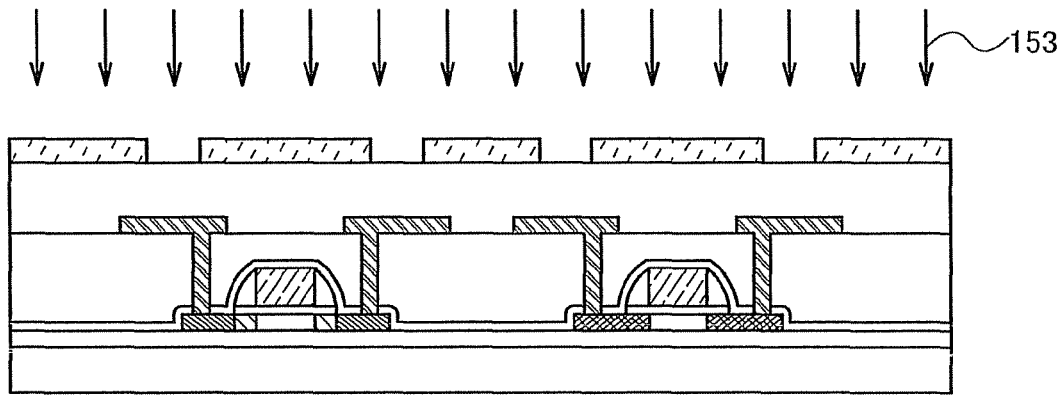
FIGS. 5A to 5C are cross-sectional views illustrating a method for manufacturing a semiconductor device.

Next, first ion doping is performed using first ions 153 at a first accelerating voltage on the opening 154a, the opening 154b, the opening 154c, and the opening 154d which reach the insulating film 151, using the resist mask 152 as a mask (see FIG. 5A). The first ions 153 may be the same as the first ions 105 in Embodiment 1. Further, an ion species may be selected depending on second ions 161 used in later steps of second doping. In addition, the first accelerating voltage may also be determined depending on the second accelerating voltage of the second doping.

Figure 5B:
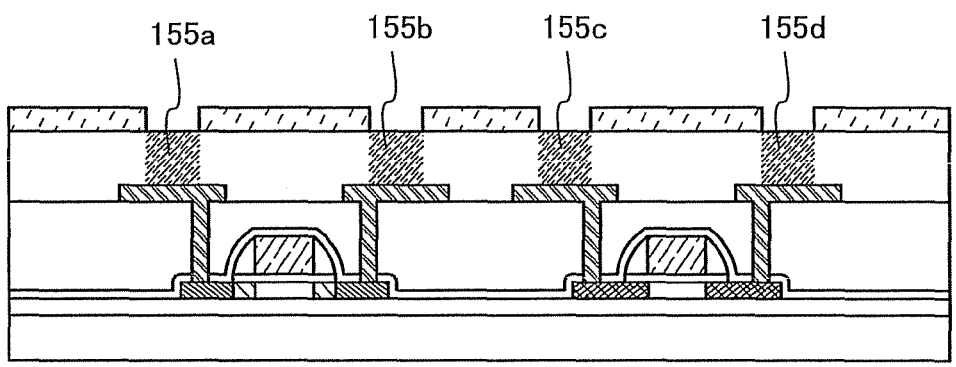

When the first ions 153 are added in the opening 154a, the opening 154b, the opening 154c, and the opening 154d, the crystal structure of a region 155a, a region 155b, a region 155c, and a region 155d in the insulating film 151 under the opening 154a, the opening 154b, the opening 154c, and the opening 154d is broken, and defects are formed (see FIG. 5B).

As described in Embodiment 1, in ion doping, the concentration peaks at a certain depth; therefore, in each of the regions the region 155a, the region 155b, the region 155c, and the region 155d, the defect concentration becomes highest at a certain depth.

Figure 5C:
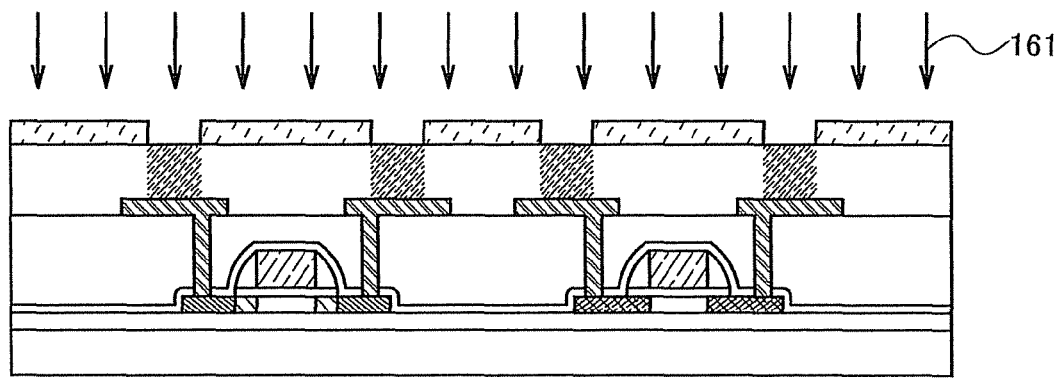

Next, second ion doping using the second ions 161 is performed on the opening 154*a*, the opening 154*b*, the opening 154*c*, and the opening 154*d* which reach the insulating film 151 at a second accelerating voltage using the resist mask 152 as a mask (see FIG. 5C). The second ions 161 may be the same as the second ions 112 in Embodiment 1.

Figure 6A:
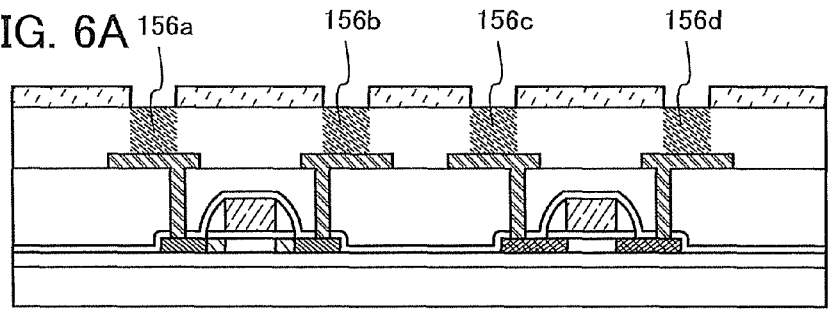
FIGS. 6A to 6D are cross-sectional views illustrating a method for manufacturing a semiconductor device.

By the second ion doping, defects are formed in a region 156*a*, a region 156*b*, a region 156*c*, and a region 156*d* in the insulating film 151 under the opening 154*a*, the opening 154*b*, the opening 154*c*, and the opening 154*d* (see FIG. 6A).

The second accelerating voltage is differentiated from the first accelerating voltage, and as shown in FIG. 2C of Embodiment 1, two regions having many defects are formed at different depths in each of the regions the region 156*a*, the region 156*b*, the region 156*c*, and the region 156*d*.

Figure 6B:
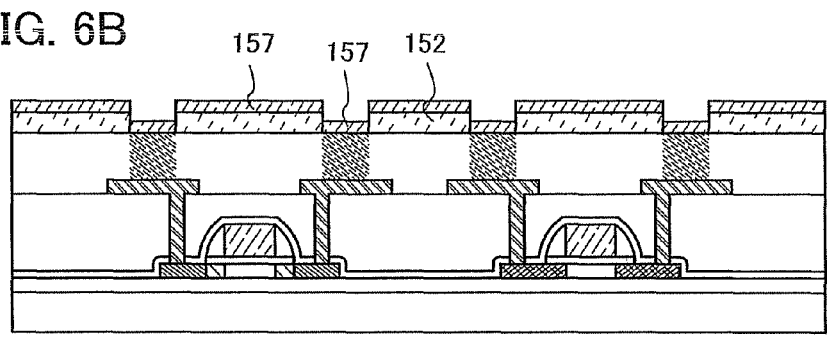
Figure 6C:
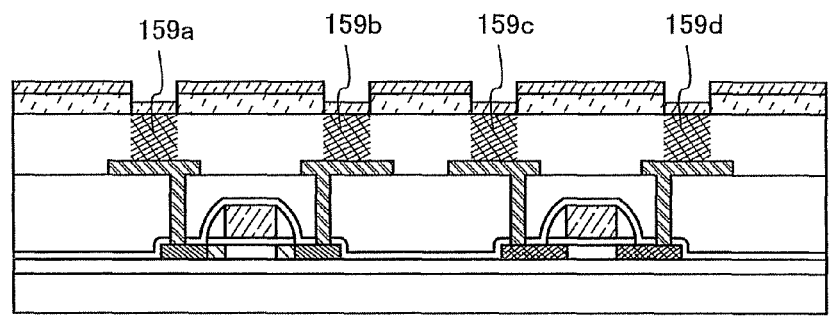
Figure 6D:
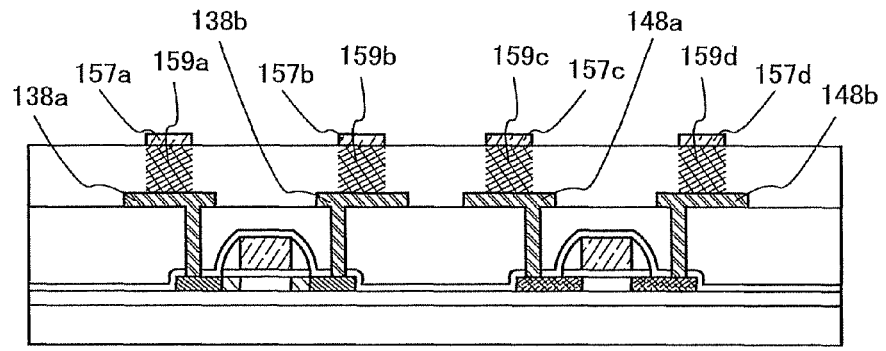

Next, a metal film 157 is formed as a conductive material film containing a metal element over the resist mask 152 and the insulating film 151 (see FIG. 6B). The metal film 157 may be formed from the same material as the metal film 116.

After the metal film 157 is formed, heating is performed to diffuse the metal element into the region 156*a*, the region 156*b*, the region 156*c*, and the region 156*d*. Thus, a conductive region 159*a*, a conductive region 159*b*, a conductive region 159*c*, and a conductive region 159*d* are formed (see FIG. 6C).

Alternatively, the resist mask 152 and the metal film 157 over the resist mask 152 may be removed before heating process. In addition, the resist mask 152 may be removed after the second ions 161 are added and the metal film 157 is formed over the insulating film 151, and then the metal film 157 over the region 156*a*, the region 156*b*, the region 156*c*, and the region 156*d* may be removed by etching.

As described in Embodiment 1, when two regions of upper and lower regions having many defects are formed by two-step ion doping, the metal element can diffuse more easily and reliably reach the electrode 138*a*, the electrode 138*b*, the electrode 148*a*, and the electrode 148*b*. Thus, the conductive region 159*a*, the conductive region 159*b*, the conductive region 159*c*, and the conductive region 159*d* with high reliability can be formed. Further, the conductive region 159*a*, the conductive region 159*b*, the conductive region 159*c*, and the conductive region 159*d* can each have a low value of resistance.

Next, the resist mask 152 and the metal film 157 over the resist mask 152 are removed. Parts of the metal film 157 which remain over the insulating film 151, and are electrically connected to the conductive region 159*a*, the conductive region 159*b*, the conductive region 159*c*, and the conductive region 159*d*, are referred to as an electrode 157*a*, an electrode 157*b*, an electrode 157*c*, and an electrode 157*d*, respectively.

Specifically, the electrode 138*a*, the conductive region 159*a*, and the electrode 157*a* are electrically connected, and the electrode 138*b*, the conductive region 159*b*, and the electrode 157*b* are electrically connected. Further, the electrode 148*a*, the conductive region 159*c*, and the electrode 157*c* are electrically connected, and the electrode 148*b*, the conductive region 159*d*, and the electrode 157*d* are electrically connected.

The TFT 139 which is an n-channel TFT and the TFT 149 which is a p-channel TFT may be separated from each other; alternatively, a CMOS circuit may be formed by connecting the electrode 138*b* and the electrode 148*a* or electrically connecting the electrode 157*b* and the electrode 157*c*.

Note that, in the case where the electrode 138*b* and the electrode 148*a* are electrically connected, only one of the conductive regions 159*a* and 159*c* may be formed. Similarly, one of the electrodes 157*b* and 157*c* may be formed.

In the semiconductor device of this embodiment, the conductive region 159*a*, the conductive region 159*b*, the conductive region 159*c*, and the conductive region 159*d* can be formed without forming contact holes in the insulating film 151. Thus, strength and planarity of the insulating film 151 can be maintained.

In this embodiment, two-step ion doping makes it possible to form two regions of upper and lower regions having many defects at different depth in the insulating film 151, so that a metal element can be diffused more reliably and uniformly.

Embodiment 3

In this embodiment, an example of manufacturing a semiconductor device through a process different from Embodiment 2 will be described with reference to FIG. 7A to FIG. 7D, FIG. 8A to FIG. 8C, FIG. 9A to FIG. 9D, FIG. 10A to FIG. 10D, FIG. 11A to FIG. 11C, FIG. 12A to FIG. 12C, and FIG. 13.

First, a first insulating layer 202 is formed over a surface of a substrate 201. Next, a release layer 203 is formed over the first insulating layer 202. Then, a second insulating layer 204 is formed over the release layer 203 (see FIG. 7A).

The substrate 201 is a substrate having an insulating surface, for example, a glass substrate, a quartz substrate, a resin (plastic) substrate, a sapphire substrate, a silicon wafer or a metal plate, which has an insulating film formed on its surface, or the like. A glass substrate or a plastic substrate is preferably used as the substrate 201. When a glass substrate or a plastic substrate is used, a substrate having a predetermined shape, for example a quadrangular shape, one meter or more on a side can be easily manufactured. For example, if a glass substrate or a plastic substrate, which has a quadrangular shape one meter or more on a side is used, since a semiconductor integrated circuit to be formed has a quadrangular shape, productivity can be greatly improved. This is a great advantage compared with the case of using a silicon substrate having a circular shape with a diameter of about 30 centimeters at most.

The first insulating layer 202 and the second insulating layer 204 are formed using a material of an oxide of silicon, a nitride of silicon, an oxide of silicon containing nitrogen, a nitride of silicon containing oxygen, or the like by vapor phase growth (CVD), sputtering, or the like. In addition, the first insulating layer 202 and the second insulating layer 204 may have a layered structure. The first insulating layer 202 prevents an impurity element from the substrate 201 from entering an upper layer. If not required, the first insulating layer 202 does not have to be formed.

The release layer 203 is formed with a single layer or a laminate by sputtering or the like using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), platinum (Pt), osmium (Os), iridium (Ir), silicon (Si), and the like; or an alloy material containing the above-described element as its main component or a compound material containing an alloy. Note that silicon contained in a layer containing silicon may be any one of amorphous, microcrystalline, and polycrystalline silicon.

When the release layer 203 has a single-layer structure, it is preferable to form a layer containing any one of tungsten, molybdenum, a mixture of tungsten and molybdenum, an oxide of tungsten, a nitride of tungsten, an oxynitride of tungsten, a nitride oxide of tungsten, an oxide of molybdenum, a nitride of molybdenum, an oxynitride of molybdenum, a nitride oxide of molybdenum, an oxide of a mixture of tungsten and molybdenum, a nitride of a mixture of tungsten and molybdenum, an oxynitride of a mixture of tungsten and molybdenum, or a nitride oxide of a mixture of tungsten and molybdenum.

When the release layer 203 is formed in a layered structure, for example, a tungsten layer, a molybdenum layer, or a layer containing a mixture of tungsten and molybdenum can be formed as a first layer, and a layer containing an oxide of tungsten, a nitride of tungsten, an oxynitride of tungsten, a nitride oxide of tungsten, an oxide of molybdenum, a nitride of molybdenum, an oxynitride of molybdenum, a nitride oxide of molybdenum, an oxide of a mixture of tungsten and molybdenum, a nitride of a mixture of tungsten and molybdenum, an oxynitride of a mixture of tungsten and molybdenum, or a nitride oxide of a mixture of tungsten and molybdenum can be formed as a second layer. These oxides or oxynitrides can be formed by performing oxygen plasma treatment or $N_2O$ plasma treatment on the surface of the first layer.

When the release layer 203 is formed to have a layered structure of a layer containing metal such as tungsten and a layer containing an oxide of the metal, a layer containing silicon oxide may be formed over the layer containing the metal, so that a layer containing an oxide of the metal can be formed at an interface between the layer containing the metal and the layer containing silicon oxide.

In addition, thermal oxidization treatment, oxygen plasma treatment, treatment using highly oxidative solution such as ozone water or the like can be performed on the surface of the layer containing the metal such as tungsten to form a layer containing an oxide of the metal over the layer containing the metal, and then, a silicon nitride layer, a silicon oxynitride layer, or a silicon nitride oxide layer can be formed thereover. This also applies to the case of forming the layer containing a nitride of the metal, an oxynitride of the metal, and a nitride oxide of the metal.

Next, semiconductor elements are formed over the second insulating layer 204. The semiconductor elements are, for example, a transistor, a diode, a capacitor, a bipolar transistor, a thin film transistor, and/or the like. In this embodiment, a case of forming the n-channel TFT 139 and the p-channel TFT 149 as semiconductor elements will be described (see FIG. 7B). Note that the method for manufacturing the n-channel TFT 139, the p-channel TFT 149, the insulating film 123, the insulating film 124, the electrode 138a, the electrode 138b, the electrode 148a, and the electrode 148b may be based on Embodiment 2.

Figure 7A:
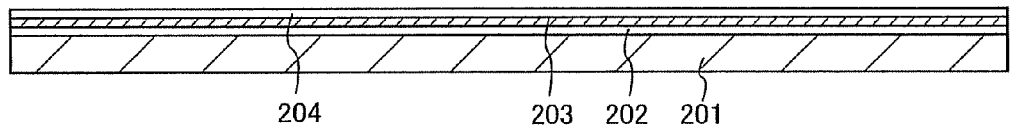
FIGS. 7A to 7D are cross-sectional views illustrating a method for manufacturing a semiconductor device.
Figure 7B:
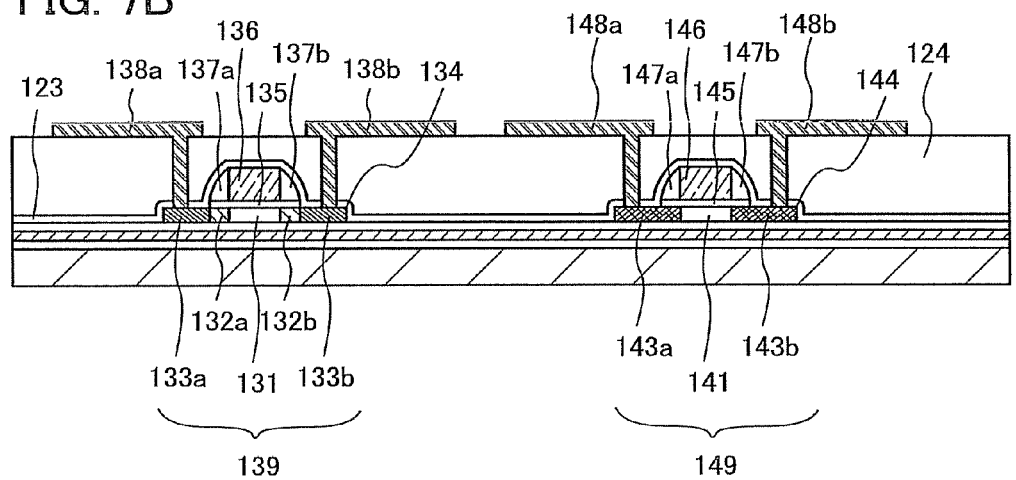
Figure 7C:
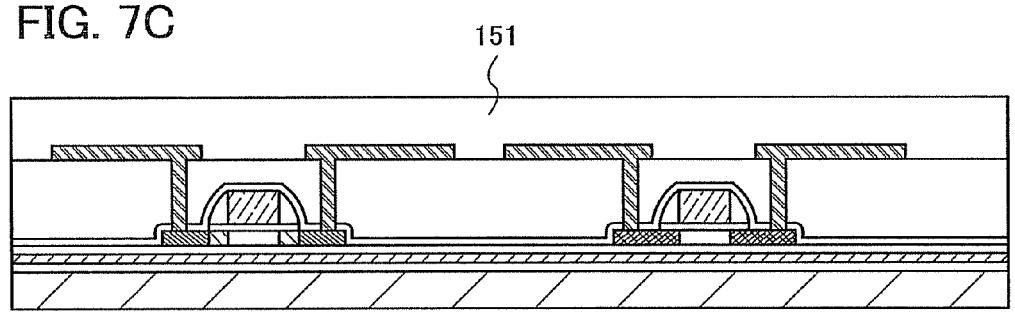

Next, an insulating film 151 is formed to cover the n-channel TFT 139, the p-channel TFT 149, the insulating film 124, the electrode 138a, the electrode 138b, the electrode 148a, and the electrode 148b (see FIG. 7C).

Figure 7D:
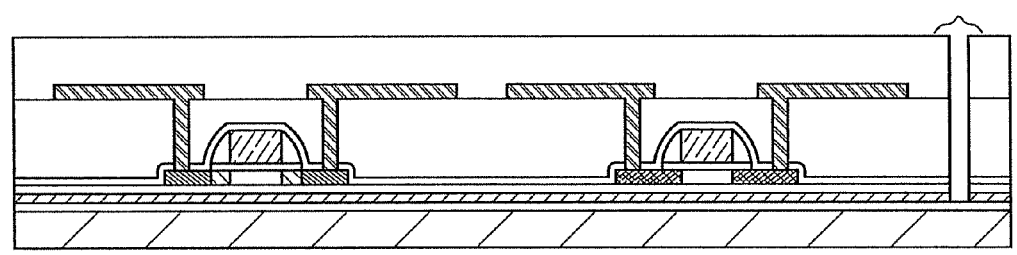

Then, an opening 205 is formed by removing part of the insulating film 151, part of the insulating film 124, part of the insulating film 123, part of the second insulating layer 204, and part of the release layer 203 so that part of the first insulating layer 202 is exposed (see FIG. 7D).

The method for forming the opening 205 is not particularly limited. For example, after a mask formed of resist or the like is provided over the insulating film 151, the opening 205 can be formed by etching the insulating film 151, the insulating film 124, the insulating film 123, the second insulating layer 204, and the release layer 203. The etching method for forming the opening 205 is not particularly limited, and wet etching, dry etching, or a method in which both of them are combined may be used.

Figure 8A:
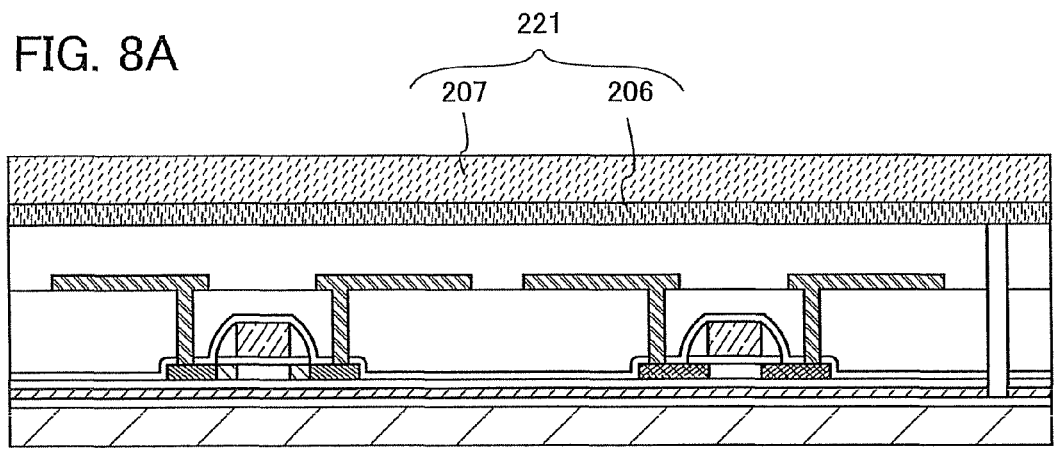
FIGS. 8A to 8C are cross-sectional views illustrating a method for manufacturing a semiconductor device.

Next, a support substrate 221 is provided over the insulating film 151 (see FIG. 8A). The support substrate 221 is a substrate in which an insulating layer 207 and an adhesive layer 206 are stacked. The adhesive layer 206 is formed using a thermoplastic resin of which adhesion is reduced by heat treatment, for example, a material which is softened by heat, a material in which microcapsules or a foaming agent which is expanded by heat, a material obtained by imparting thermally melting properties or pyrolytic properties to a thermosetting resin, or a material in which degradation of interface strength caused by water intrusion and a water absorbing resin is expanded accordingly. In this specification, the support substrate 221 in which the insulating layer 207 and the adhesive layer 206 are combined is also referred to a heat peelable support substrate.

In addition, instead of the heat peelable supporting substrate, a heat peelable film of which adhesion is reduced by heat treatment, or a UV (ultraviolet ray) peelable film of which adhesion is reduced by UV (ultraviolet ray) irradiation, or the like may be used. A UV peelable film is a film in which the insulating layer 207 and the adhesive layer 206 are stacked of which adhesion is decreased by UV (ultraviolet ray) irradiation.

Figure 8B:
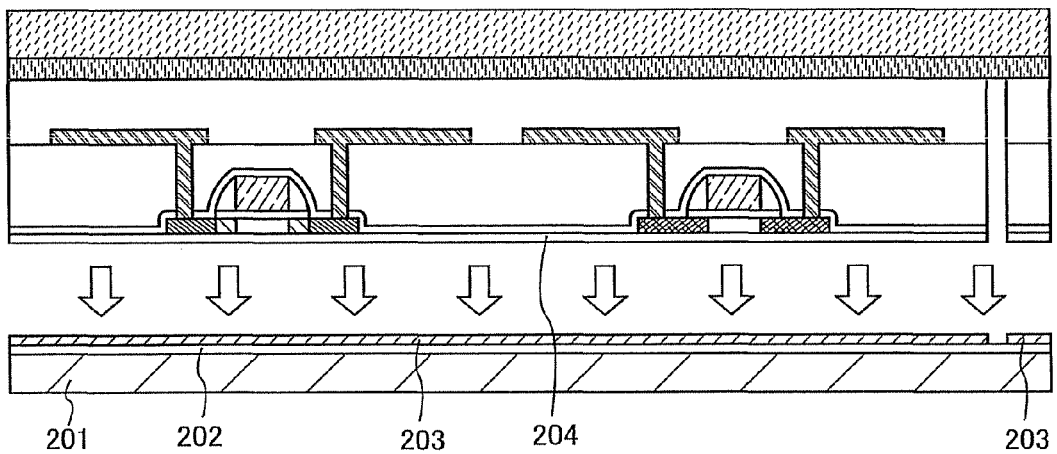

Next, the substrate 201 and the semiconductor elements are separated inside the release layer 203 or at the boundary between the release layer 203 and the second insulating layer 204, by using the support substrate 221. The structure shown in FIG. 8B illustrates the case where the separation is performed at the boundary between the release layer 203 and the second insulating layer 204. In this manner, the separation process can be performed easily in a short time by using the supporting substrate 221.

Figure 8C:
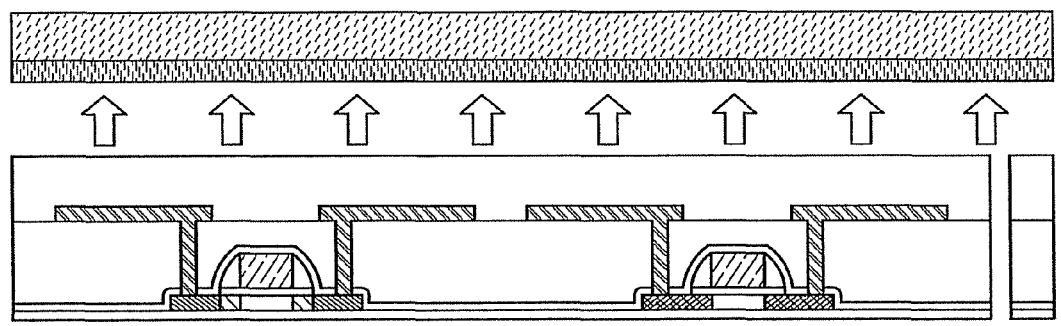

Then, adhesion between the adhesive layer 206 and the insulating film 151 is reduced by heat treatment to separate the support substrate 221 from the semiconductor elements (see FIG. 8C).

Figure 9A:
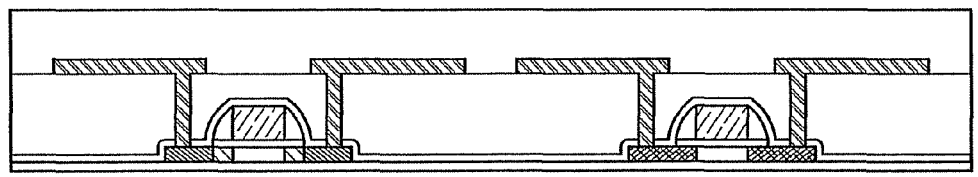
FIGS. 9A to 9D are cross-sectional views illustrating a method for manufacturing a semiconductor device.

At the time of separating the support substrate 221 from the semiconductor elements, other part of the insulating film 151, other part of the insulating film 124, other part of the insulating film 123, and other part of the second insulating layer 204 are removed due to the opening 205 (see FIG. 9A).

Figure 9B:
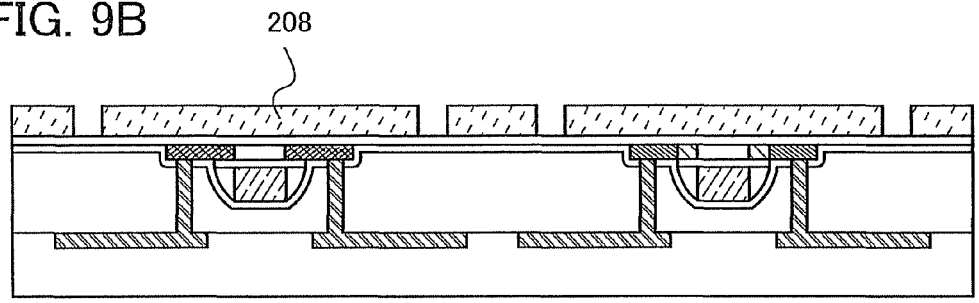
Figure 9C:
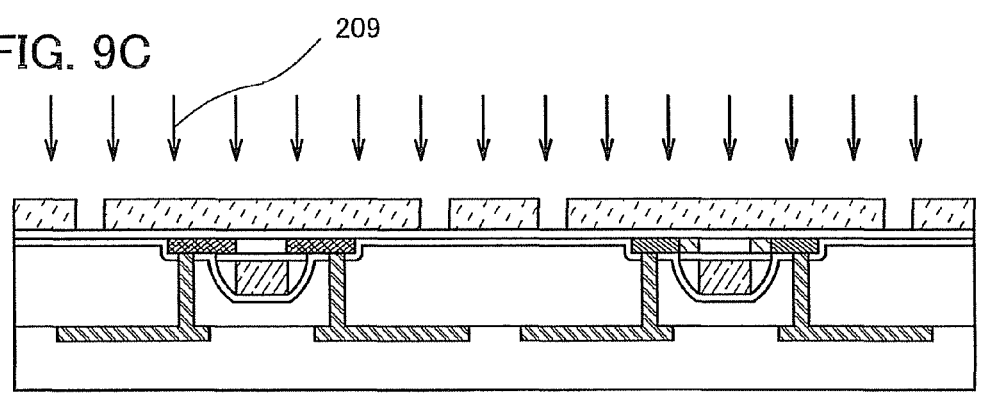

Next, resist masks 208 are formed in regions over the second insulating layer 204 which correspond to the electrode 138a, the electrode 138b, the electrode 148a, and the electrode 148b (see FIG. 9B).

Figure 9D:
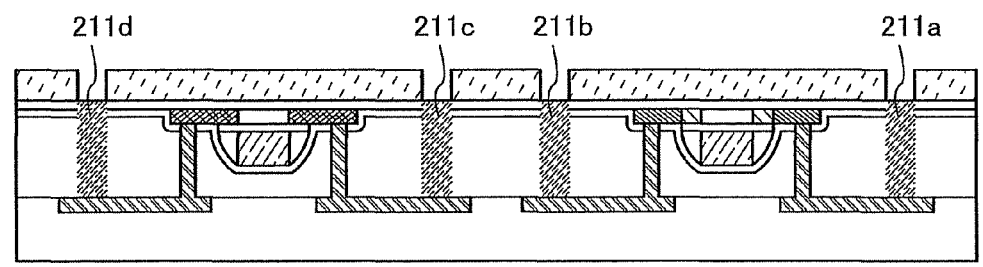

Then, first ion doping is performed using first ions 209 at a first accelerating voltage (see FIG. 9C), so that a region 211a, a region 211b, a region 211c, and a region 211d which have many defects are formed (see FIG. 9D). The first ions 209 may be the same as the first ions 105 in Embodiment 1. Further, ion species may be selected depending on second ions 210 used in later steps of second doping. In addition, the first accelerating voltage may be determined depending on the second accelerating voltage of the second doping.

Figure 10A:
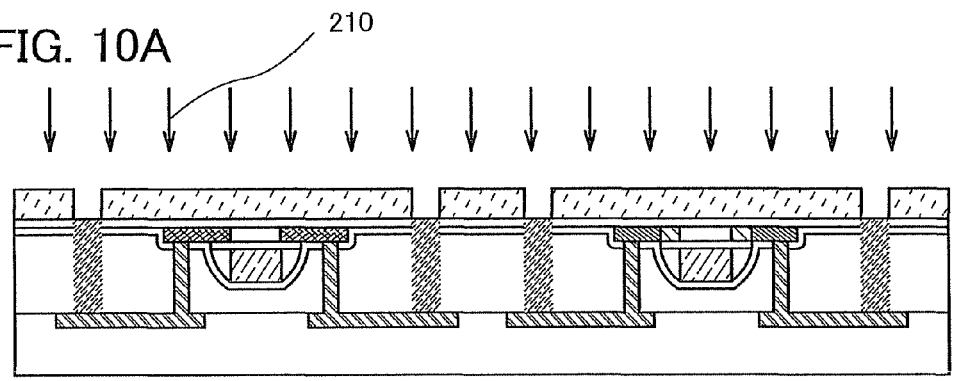
FIGS. 10A to 10D are cross-sectional views illustrating a method for manufacturing a semiconductor device.
Figure 10B:
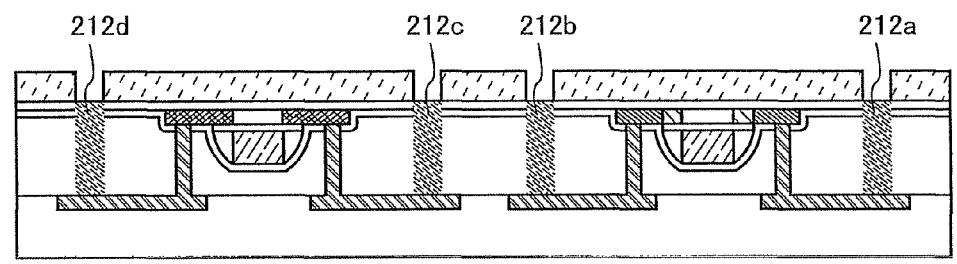

Then, second ion doping is performed using the second ions 210 at a second accelerating voltage using the resist masks 208 (see FIG. 10A), so that a region 212a, a region 212b, a region 212c, and a region 212d which have many defects are faulted (see FIG. 10B).

As described in Embodiment 1 and Embodiment 2, two defect regions are formed at different depths in each of the regions the region 212a, the region 212b, the region 212c, and the region 212d by varying the first accelerating voltage and the second accelerating voltage.

Figure 10C:
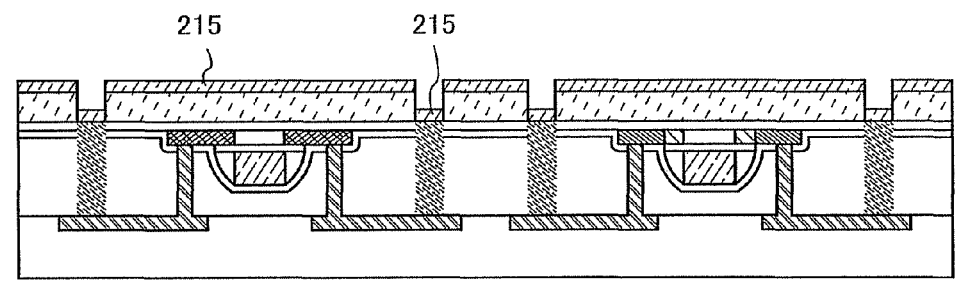

Next, a metal film 215 is formed over the insulating layer 204 and the resist masks 208 (see FIG. 10C).

Figure 10D:
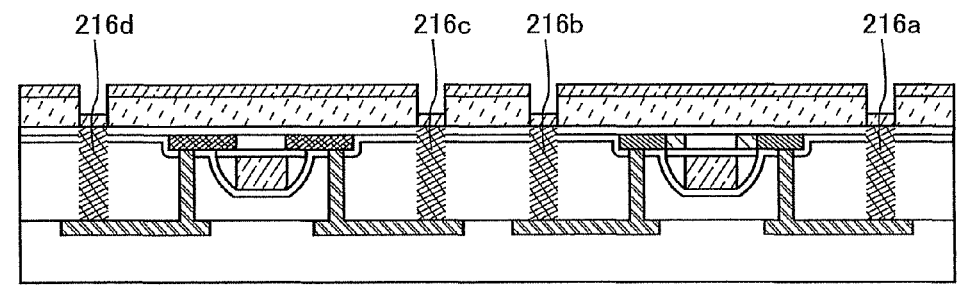

Then, a metal element is diffused into the region 211a, the region 211b, the region 211c, and the region 211d by heating process to form a conductive region 216a, a conductive region 216b, a conductive region 216c, and a conductive region 216d (see FIG. 10D).

Subsequently, the resist masks 208 and the metal film 215 over the resist masks 208 are removed. Parts of the metal film 215 which are over the conductive region 216a, the conductive region 216b, the conductive region 216c, and the conductive region 216d become an electrode 215a, an electrode 215b, an electrode 215c, and an electrode 215d, respectively. Through the above steps, a semiconductor circuit element 231 is manufactured (see FIG. 11A).

The electrode 138a, the conductive region 216a, and the electrode 215a are electrically connected. The electrode 138b, the conductive region 216b, and the electrode 215b are electrically connected. Further, the electrode 148a, the conductive region 216c, and the electrode 215c are electrically connected. The electrode 148b, the conductive region 216d, and the electrode 215d are electrically connected.

Figure 11A:
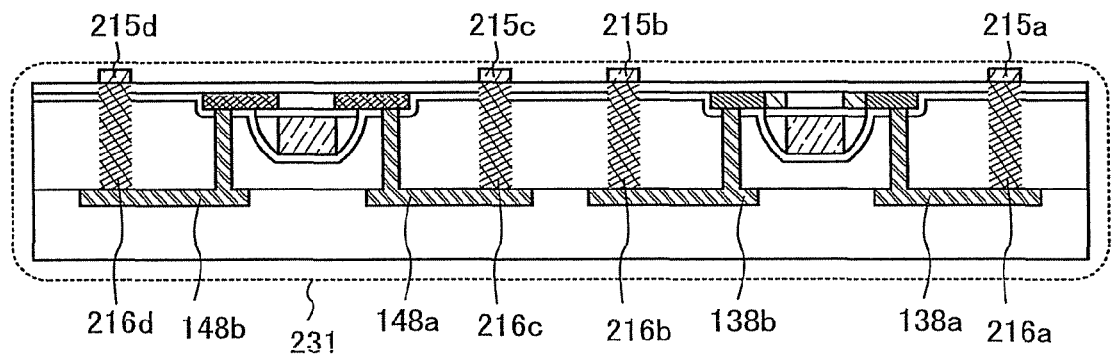
FIGS. 11A to 11C are cross-sectional views illustrating a method for manufacturing a semiconductor device.
Figure 11B:
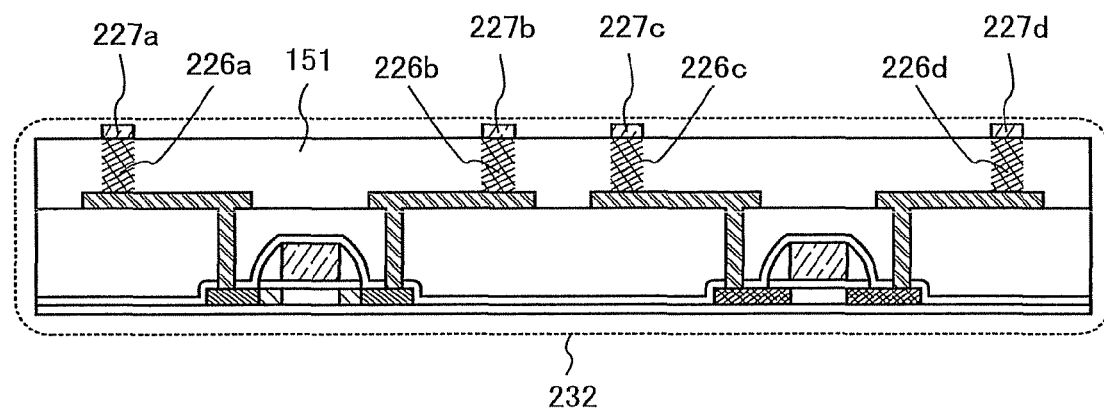

As in Embodiment 2, a conductive region may be formed in the insulating film 151. After the structure illustrated in FIG. 9A is obtained, a region having many defects is formed in the insulating film 151, and a metal element may be diffused thereinto, to aim a conductive region 226a, a conductive region 226b, a conductive region 226c, and a conductive region 226d in the insulating film 151. An electrode 227a, an electrode 227b, an electrode 227c, and an electrode 227d are formed over the conductive region 226a, the conductive region 226b, the conductive region 226c, and the conductive region 226d, respectively (see FIG. 11B). The structure illustrated in FIG. 11B is a semiconductor circuit element 232.

The electrode 138a, the conductive region 226a, and the electrode 227a are electrically connected. The electrode 138b, the conductive region 226b, and the electrode 227b are electrically connected. Further, the electrode 148a, the conductive region 226c, and the electrode 227c are electrically connected. The electrode 148b, the conductive region 226d, and the electrode 227d are electrically connected.

Figure 11C:
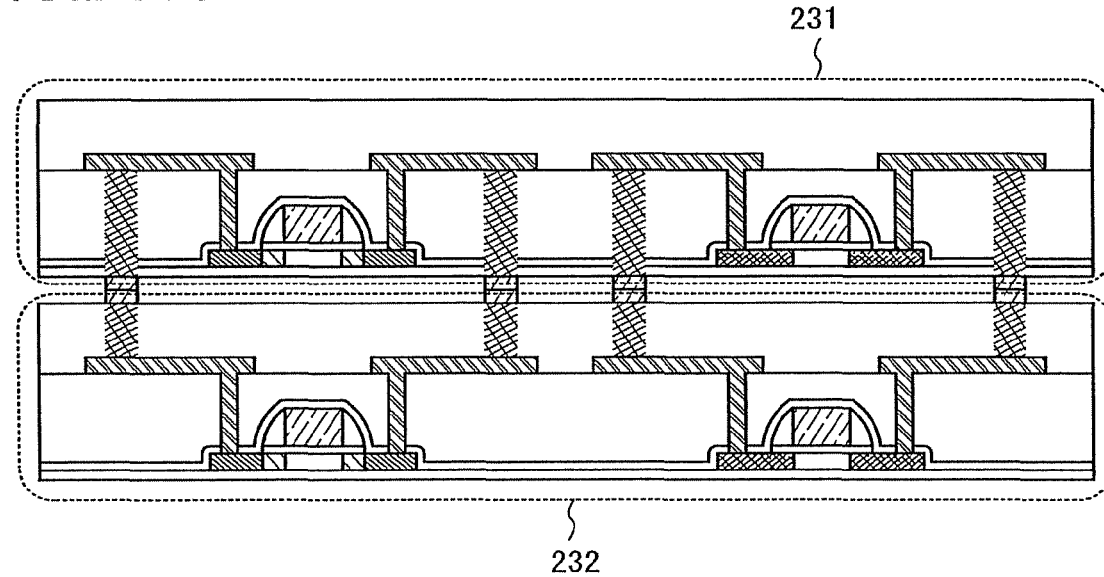

Further, a structure in which the semiconductor circuit element 231 and the semiconductor circuit element 232 are combined is illustrated in FIG. 11C. In the structure illustrated in FIG. 11C, the electrode 215a, the electrode 215b, the electrode 215c, and the electrode 215d of the semiconductor circuit element 231 is electrically connected to the electrode 227a, the electrode 227b, the electrode 227c, and the electrode 227d of the semiconductor circuit element 232, respectively; thus, a three-dimensional circuit element can be fabricated.

Figure 12A:
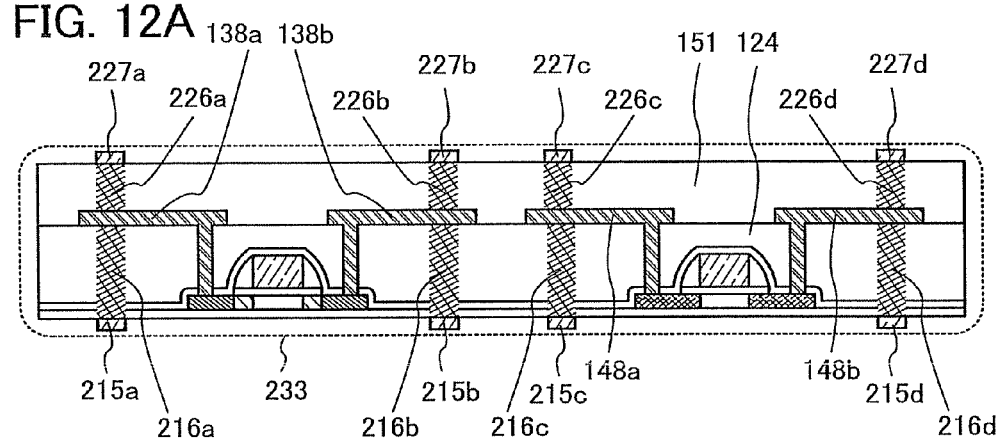
FIGS. 12A to 12C are cross-sectional views illustrating a method for manufacturing a semiconductor device.
Figure 12B:
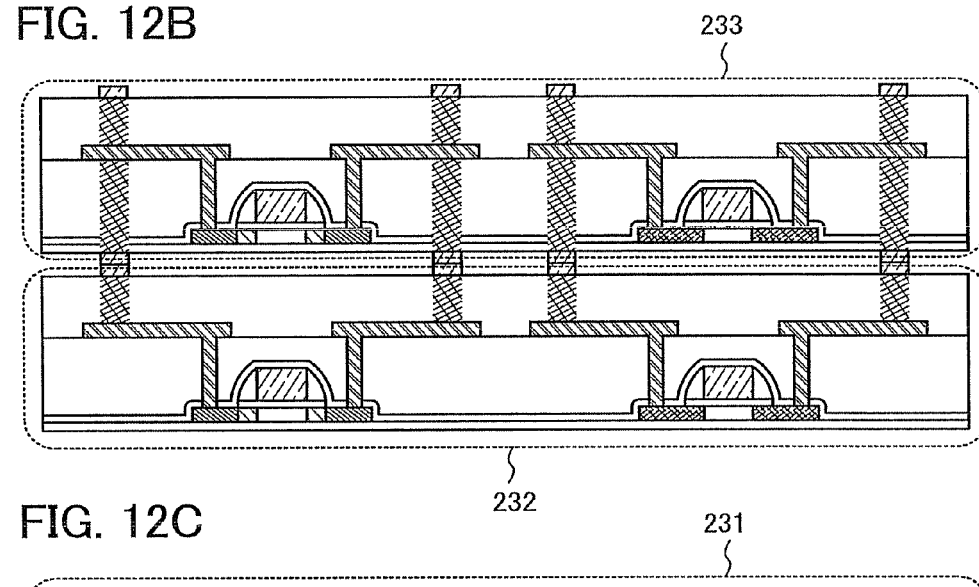

Further, as shown in FIG. 12A, a semiconductor circuit element 233 may be manufactured in which the conductive region 216a, the conductive region 216b, the conductive region 216c, and the conductive region 216d are formed in the insulating film 124, and the conductive region 226a, the conductive region 226b, the conductive region 226c, and the conductive region 226d are formed in the insulating film 151.

In the semiconductor circuit element 233, the electrode 138a of the TFT 139 is electrically connected to the conductive region 216a, the electrode 215a, the conductive region 226a, and the electrode 227a. The electrode 138b of the TFT 139 is electrically connected to the conductive region 216b, the electrode 215b, the conductive region 226b, and the electrode 227b. Further, the electrode 148a of the TFT 149 is electrically connected to the conductive region 216c, the electrode 215c, the conductive region 226c, and the electrode 227c. The electrode 148b of the TFT 149 is electrically connected to the conductive region 216d, the electrode 215d, the conductive region 226d, and the electrode 227d.

Figure 12C:
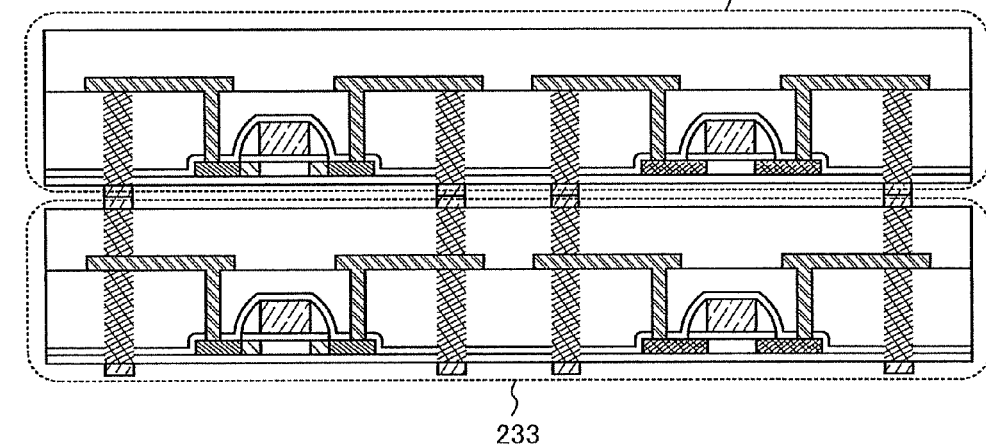

In addition, the semiconductor circuit element 232 and the semiconductor circuit element 233 may be arranged in a three-dimensional manner (see FIG. 12B); the semiconductor circuit element 231 and the semiconductor circuit element 233 may be arranged in a three-dimensional manner (see FIG. 12C).

Figure 13:
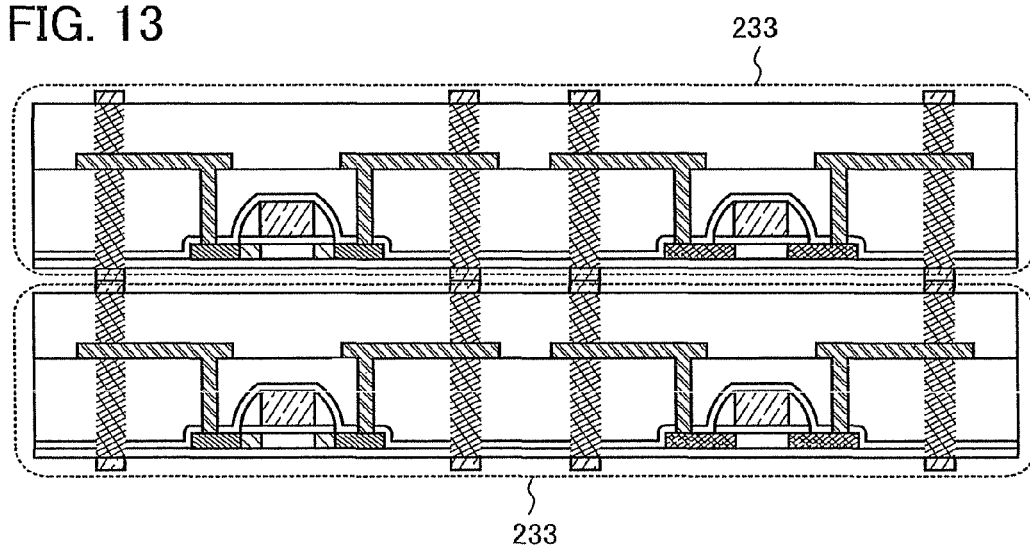
FIG. 13 is a cross-sectional view illustrating a method for manufacturing a semiconductor device.

Alternatively, a plurality of semiconductor circuit elements 233 may be arranged in a three-dimensional manner. FIG. 13 illustrates a structure in which two semiconductor circuit elements 233 are arranged in a three-dimensional manner. One or both of the semiconductor circuit element 231 and the semiconductor circuit element 232 may be arranged in addition to a plurality of semiconductor circuit elements 233 that are arranged in a three-dimensional manner.

In the semiconductor device of this embodiment, the conductive region 216a, the conductive region 216b, the conductive region 216c, and the conductive region 216d; the conductive region 226a, the conductive region 226b, the conductive region 226c, and the conductive region 226d; or all of them can be formed without forming contact holes in the insulating layer 204, the insulating film 123, the insulating film 124, or the insulating film 151 or all of them. Thus, strength and planarity of the insulating layer 204, the insulating film 123, the insulating film 124, or the insulating film 151 or all of them can be maintained.

In this embodiment, two-step ion doping makes it possible to form two regions of upper and lower regions having many defects at different depth in the insulating layer 204, the insulating film 123, the insulating film 124, or the insulating film 151 or all of them, so that a metal element can be diffused more reliably and uniformly.

Example 1

In this example, the result of calculations to find the relationship between accelerating voltage and the concentration and the relationship between the ion species and the concentration in ion doping will be described with reference to FIG. 14, FIG. 15, FIG. 16, FIG. 17, and FIG. 18.

A film doped with ions, which is used in this example is a silicon oxide film ($SiO_2$ film) having a density of 2.3 g/cm$^3$, and the number of introduced ions is 99999. The ion species used are argon (Ar) and hydrogen (H).

Figure 14:
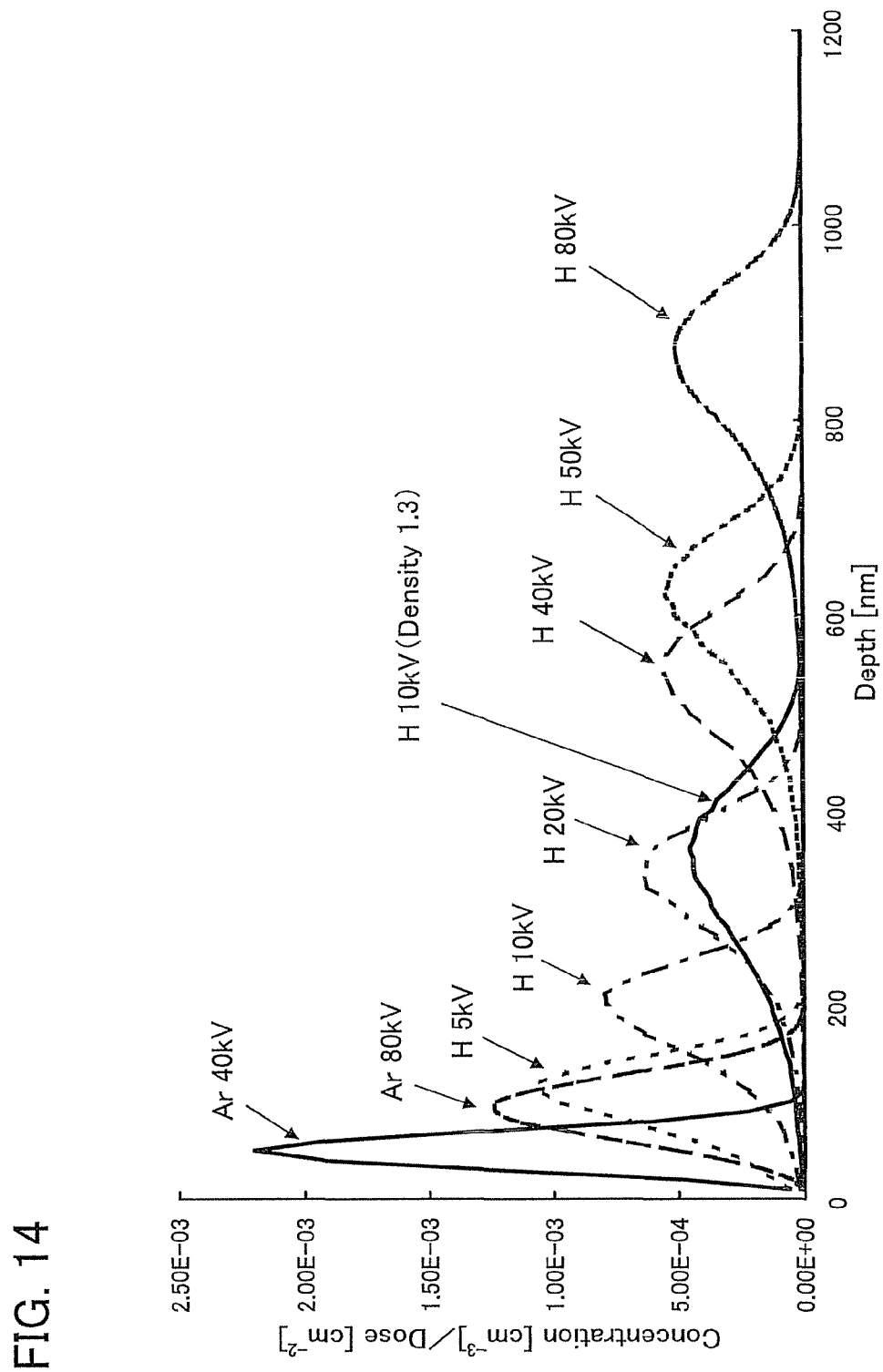
FIG. 14 is a graph illustrating the relationship between the kind of ions, accelerating voltage, and depth in ion doping.

In FIG. 14, calculations were performed using argon (Ar) as an ion species at an accelerating voltage of 40 kV, argon (Ar) as an ion species at an accelerating voltage of 80 kV, hydrogen (H) as an ion species at an accelerating voltage of 5 kV, hydrogen (H) as an ion species at an accelerating voltage of 10 kV, hydrogen (H) as an ion species at an accelerating voltage of 5 kV, hydrogen (H) as an ion species at an accelerating voltage of 10 kV, hydrogen (H) as an ion species at an accelerating voltage of 20 kV, hydrogen (H) as an ion species at an accelerating voltage of 40 kV, hydrogen (H) as an ion species at an accelerating voltage of 50 kV, hydrogen (H) as an ion species at an accelerating voltage of 80 kV, and hydrogen (H) as an ion species at an accelerating voltage of 10 kV (note that the density of the silicon oxide film ($SiO^2$ film) is assumed to be 1.3 g/cm$^3$).

Figure 15:
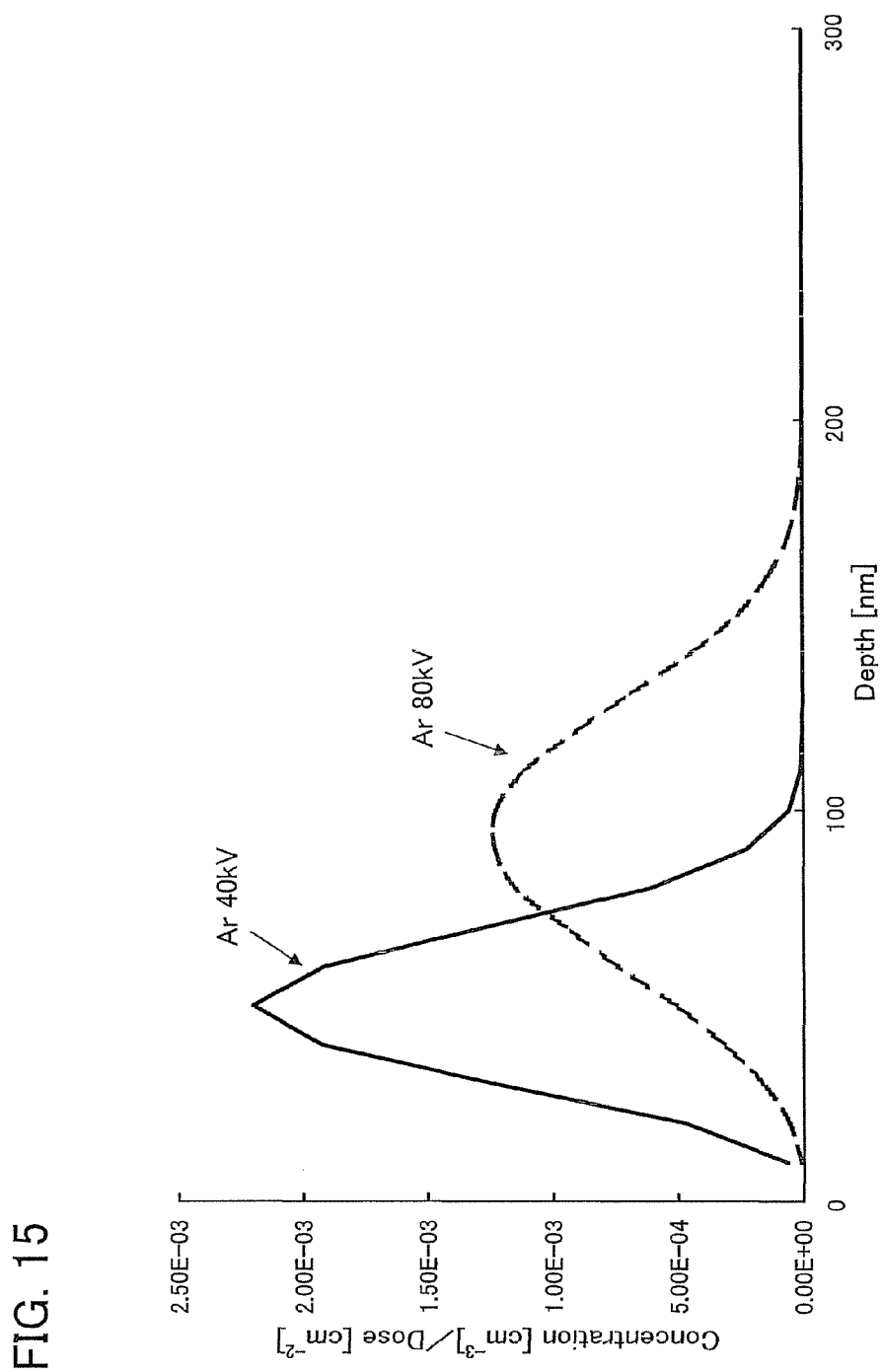
FIG. 15 is a graph illustrating the relationship between accelerating voltage and depth in ion doping.

FIG. 15 illustrates the result of calculation where argon (Ar) was used as an ion species and the accelerating voltage was changed. When comparing the case of introducing argon at an accelerating voltage of 40 kV and the case of introducing argon at an accelerating voltage of 80 kV, the concentration is high and the concentration peaks at a shallow depth in the case of introduction at 40 kV. On the other hand, in the case of introduction at 80 kV, the concentration is lower; however, the concentration peaks at a deeper portion.

Figure 16:
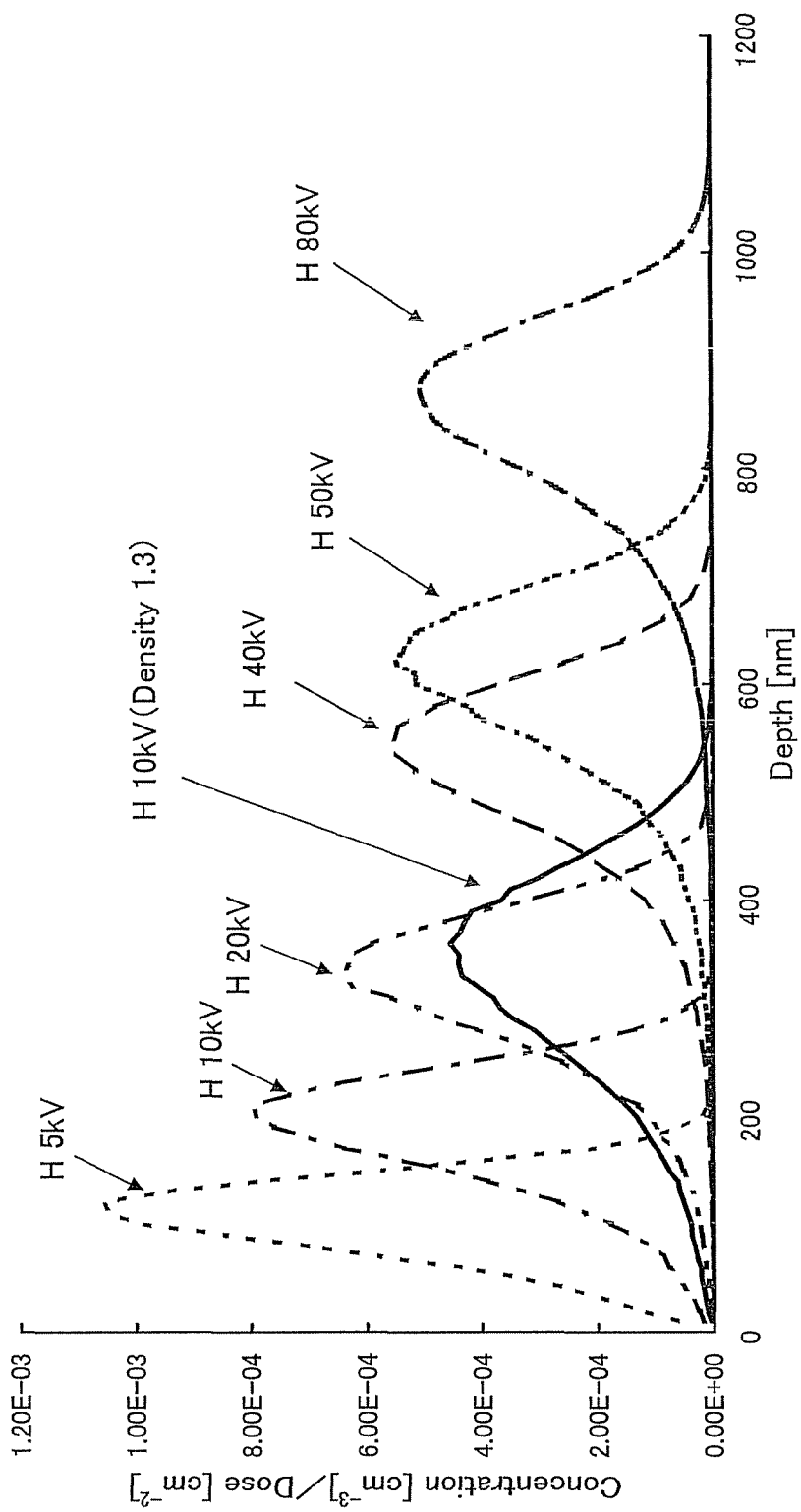
FIG. 16 is a graph illustrating the relationship between accelerating voltage and depth in ion doping.

Further, FIG. 16 illustrates the result of calculation where hydrogen (H) was used as ion species and the accelerating voltage was changed. In FIG. 16, the concentration is high in the case of an accelerating voltage of 5 kV; however, there is not much change other than that even when the accelerating voltage is changed.

Figure 17:
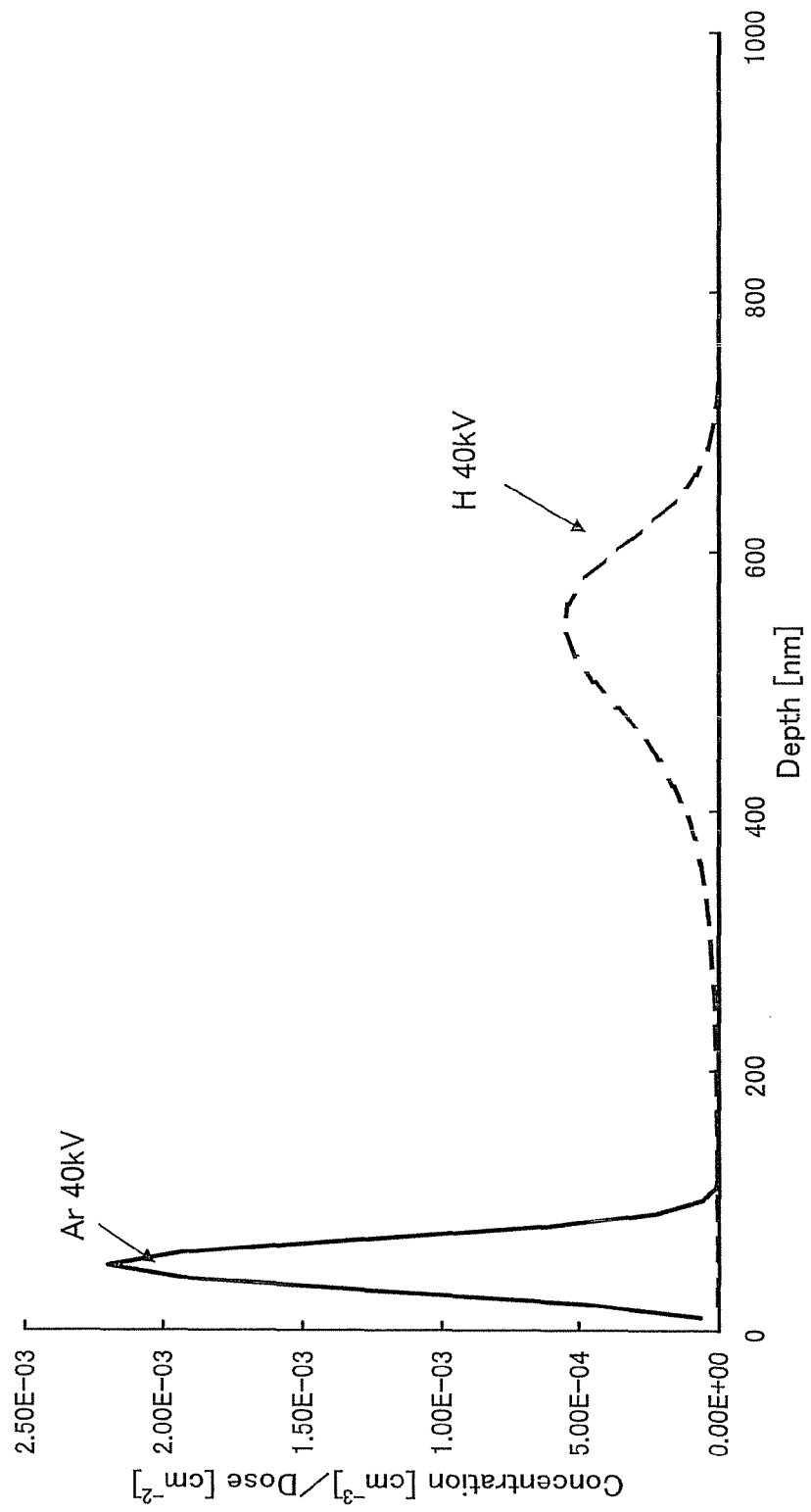
FIG. 17 is a graph illustrating the relationship between the kind of ions and depth in ion doping.
Figure 18:
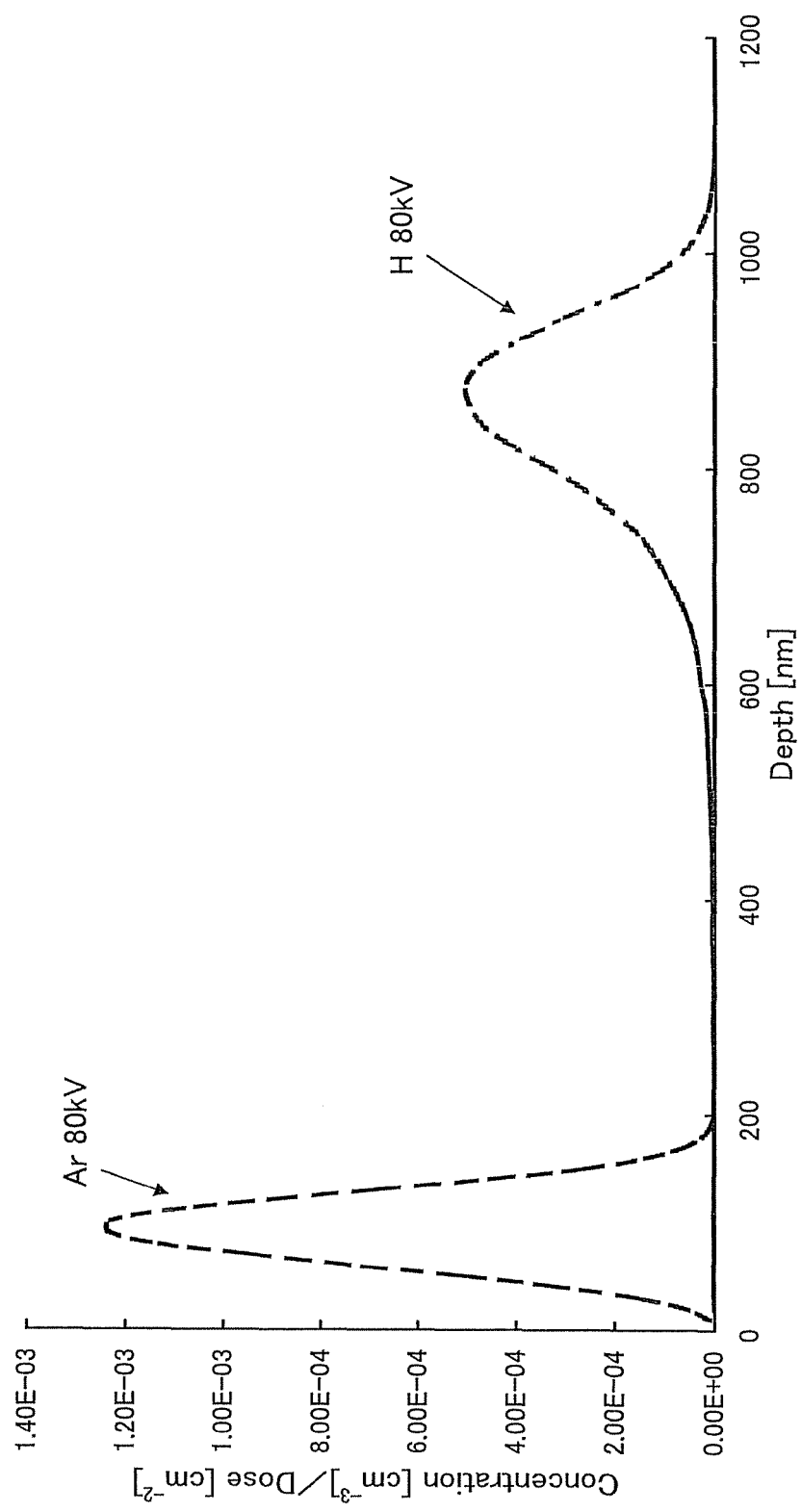
FIG. 18 is a graph illustrating the relationship between the kind of ions and depth in ion doping.

FIG. 17 and FIG. 18 are graphs illustrating how the ion species are different in the case where the accelerating voltage is constant (40 kV and 80 kV). Argon (Ar) that is a heavy atom is only added to a shallow position despite the concentration is high as compared with hydrogen (H). Conversely, hydrogen (H) that is a lightweight atom is added to a deep depth; however, the concentration is low.

As shown in FIG. 14 to FIG. 18, the depth and the concentration of introduction can be controlled by varying ion species or acceleration voltages. Thus, the depth and concentration of regions in insulating films where many defects exist can be controlled.

This application is based on Japanese Patent Application serial No. 2008-217613 filed with Japan Patent Office on Aug. 27, 2008, the entire contents of which are hereby incorporated by reference.

What is claimed is:

1. A semiconductor device comprising:
    a substrate;
    a semiconductor element over the substrate, the semiconductor element comprising a first semiconductor layer, a first insulating layer and a first electrode;
    wherein the first semiconductor layer comprises a first channel formation region and a first high concentration impurity region,
    wherein the first electrode is provided over the first semiconductor layer,
    wherein the first insulating layer is interposed between the first semiconductor layer and the first electrode,
    a second insulating film over the semiconductor element;
    a second electrode over the second insulating film, wherein the second electrode is connected to the first high concentration impurity region;
    a third insulating film over the second electrode; and
    a thin film transistor over the third insulating film, wherein the thin film transistor comprises a second semiconductor layer, a fourth insulating layer and a third electrode,
    wherein the second semiconductor layer comprises a second channel formation region and a second high concentration impurity region,
    wherein the second high concentration impurity region comprises an impurity element which imparts n-type conductivity,
    wherein the third electrode is provided over the second semiconductor layer, and
    wherein the fourth insulating layer is interposed between the second semiconductor layer and the third electrode,
    a fifth insulating film over the thin film transistor; and
    a fourth electrode over the fifth insulating film, wherein the fourth electrode is connected to the second high concentration impurity region and is electrically connected to the second electrode,
    wherein the first high concentration impurity region partly overlaps with the second high concentration impurity region.

2. The semiconductor device according to claim 1, further comprising a metal layer over the third insulating film, wherein the second electrode and the metal layer are electrically connected by a diffused metal element.

3. The semiconductor device according to claim 1, wherein the first high concentration impurity region imparts n-type conductivity.

4. The semiconductor device according to claim 1, wherein the second insulating film comprises a material selected from the group consisting of a silicon oxide film, a silicon nitride film, a silicon oxide film containing nitrogen, and a silicon nitride film containing oxygen.

5. The semiconductor device according to claim 1, wherein the second insulating film comprises a single layer or multi layers comprising at least one of materials selected from the group consisting of polyimide, polyamide, polyimide amide, benzocyclobutene, acrylic, epoxy, a siloxane material, a polysilazane material and a laminate thereof.

6. The semiconductor device according to claim 1, wherein the third insulating film comprises a material selected from the group consisting of a silicon oxide film, a silicon nitride film, a silicon oxide film containing nitrogen and a silicon nitride film containing oxygen.

7. The semiconductor device according to claim 1, wherein the third insulating film comprises a single layer or multi layers comprising at least one of materials selected from the group consisting of polyimide, polyamide, polyimide amide, benzocyclobutene, acrylic, epoxy, a siloxane material and a polysilazane material.

8. The semiconductor device according to claim 1, wherein the fifth insulating film comprises a material selected from the group consisting of a silicon oxide film, a silicon nitride film, a silicon oxide film containing nitrogen and a silicon nitride film containing oxygen.

9. The semiconductor device according to claim 1, wherein the fifth insulating film comprises a single layer or multi layers comprising at least one of materials selected from the group consisting of polyimide, polyamide, polyimide amide, benzocyclobutene, acrylic, epoxy, a siloxane material and a polysilazane material.

10. A semiconductor device comprising:
    a substrate;
    a semiconductor element over the substrate, the semiconductor element comprising a first semiconductor layer, a first insulating layer and a first electrode;
    wherein the first semiconductor layer comprises a first channel formation region and a first high concentration impurity region,
    wherein the first electrode is provided over the first semiconductor layer,
    wherein the first insulating layer is interposed between the first semiconductor layer and the first electrode,
    a second insulating film over the semiconductor element;
    a second electrode over the second insulating film, wherein the second electrode is electrically connected to the first high concentration impurity region;
    a third insulating film over the second electrode; and
    a thin film transistor over the third insulating film, wherein the thin film transistor comprises a second semiconductor layer, a fourth insulating layer and a third electrode,
    wherein the second semiconductor layer comprises a second channel formation region and a second high concentration impurity region,
    wherein the second high concentration impurity region comprises an impurity element which imparts n-type conductivity
    wherein the third electrode is provided over the second semiconductor layer, and
    wherein the fourth insulating layer is interposed between the second semiconductor layer and the third electrode,
    a fifth insulating film over the thin film transistor;

a fourth electrode over the fifth insulating film, wherein the fourth electrode is connected to the second high concentration impurity region and is electrically connected to the second electrode; and a sixth insulating film over the thin film transistor, the sixth insulating film comprising silicon and fluorine, wherein the first high concentration impurity region partly overlaps with the second high concentration impurity region.

11. The semiconductor device according to claim 10, further comprising a metal layer over the third insulating film, wherein the second electrode and the metal layer are electrically connected by a diffused metal element.

12. The semiconductor device according to claim 10, wherein the first high concentration impurity region imparts n-type conductivity.

13. The semiconductor device according to claim 10, wherein the second insulating film comprises a material selected from the group consisting of a silicon oxide film, a silicon nitride film, a silicon oxide film containing nitrogen, and a silicon nitride film containing oxygen.

14. The semiconductor device according to claim 10, wherein the second insulating film comprises a single layer or multi layers comprising at least one of materials selected from the group consisting of polyimide, polyamide, polyimide amide, benzocyclobutene, acrylic, epoxy, a siloxane material, a polysilazane material and a laminate thereof.

15. The semiconductor device according to claim 10, wherein the third insulating film comprises a material selected from the group consisting of a silicon oxide film, a silicon nitride film, a silicon oxide film containing nitrogen and a silicon nitride film containing oxygen.

16. The semiconductor device according to claim 10, wherein the third insulating film comprises a single layer or multi layers comprising at least one of materials selected from the group consisting of polyimide, polyamide, polyimide amide, benzocyclobutene, acrylic, epoxy, a siloxane material and a polysilazane material.

17. The semiconductor device according to claim 10, wherein the fifth insulating film comprises a material selected from the group consisting of a silicon oxide film, a silicon nitride film, a silicon oxide film containing nitrogen and a silicon nitride film containing oxygen.

18. The semiconductor device according to claim 10, wherein the fifth insulating film comprises a single layer or multi layers comprising at least one of materials selected from the group consisting of polyimide, polyamide, polyimide amide, benzocyclobutene, acrylic, epoxy, a siloxane material and a polysilazane material.

* * * * *

UNITED STATES PATENT AND TRADEMARK OFFICE
CERTIFICATE OF CORRECTION

| | | |
|---|---|---|
| PATENT NO. | : 8,530,973 B2 | Page 1 of 1 |
| APPLICATION NO. | : 13/547393 | |
| DATED | : September 10, 2013 | |
| INVENTOR(S) | : Kazuya Hanaoka and Miki Suzuki | |

It is certified that error appears in the above-identified patent and that said Letters Patent is hereby corrected as shown below:

In the Specification:

Column 2, line 18; Change "fanned in" to --formed in--.
Column 9, line 56; Change "1486," to --148b,--.
Column 12, line 58; Change "faulted" to --formed--.
Column 13, line 24; Change "to aim a" to --to form a--.

In the Claims:

Column 16, line 62, Claim 10; Change "conductivity" to --conductivity,--.

Signed and Sealed this
Seventh Day of January, 2014

Margaret A. Focarino
*Commissioner for Patents of the United States Patent and Trademark Office*